US012777949B2

(12) United States Patent
Chung et al.

(10) Patent No.: US 12,777,949 B2
(45) Date of Patent: Oct. 27, 2026

(54) SEMICONDUCTOR PACKAGE AND MANUFACTURING METHOD FOR THE SAME

(71) Applicant: Samsung Electronics Co., Ltd., Suwon-si (KR)

(72) Inventors: Hyunsoo Chung, Suwon-si (KR); Kwang-Soo Kim, Suwon-si (KR); Chi Woo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 342 days.

(21) Appl. No.: 18/626,700

(22) Filed: Apr. 4, 2024

(65) Prior Publication Data

US 2025/0087570 A1 Mar. 13, 2025

(30) Foreign Application Priority Data

Sep. 11, 2023 (KR) ........................ 10-2023-0120461

(51) Int. Cl.

| | |
|---|---|
| ***H10W 70/63*** | (2026.01) |
| ***H10W 70/60*** | (2026.01) |
| ***H10W 74/01*** | (2026.01) |
| ***H10W 74/10*** | (2026.01) |
| ***H10W 74/15*** | (2026.01) |
| ***H10W 74/47*** | (2026.01) |

(Continued)

(52) U.S. Cl.

CPC ....... *H10W 70/635* (2026.01); *H10W 70/614* (2026.01); *H10W 74/012* (2026.01); *H10W 74/129* (2026.01); *H10W 74/15* (2026.01); *H10W 74/47* (2026.01); *H10W 90/00* (2026.01); *H10W 90/701* (2026.01); *H10W 90/297* (2026.01)

(58) Field of Classification Search

CPC . H10W 70/614; H10W 74/129; H10W 74/15; H10W 90/00

See application file for complete search history.

(56) References Cited

U.S. PATENT DOCUMENTS

| | | | |
|---|---|---|---|
| 9,741,689 | B2 | 8/2017 | Chang et al. |
| 11,270,977 | B2 | 3/2022 | Jain et al. |
| 11,309,246 | B2 | 4/2022 | Dabral et al. |

(Continued)

*Primary Examiner* — Daniel P Shook

(74) *Attorney, Agent, or Firm* — Muir Patent Law, PLLC

(57) ABSTRACT

A semiconductor package includes a redistribution layer structure, a first sub-package positioned on the redistribution layer structure, a second sub-package positioned on the first sub-package, and a first encapsulant positioned on the first sub-package and encapsulating the second sub-package. The first sub-package includes a first semiconductor chip including a first chip through via and a dielectric through via electrically connected to the redistribution layer structure. The second sub-package includes a second semiconductor chip including a plurality of second chip through vias, each second chip through via electrically connected to one of the first chip through via and the dielectric through via, a third semiconductor chip positioned on the second semiconductor chip, and a fourth semiconductor chip positioned on the third semiconductor chip. Each of the second to fourth semiconductor chips is exposed at a side surface of the second sub-package and covered with the first encapsulant.

16 Claims, 18 Drawing Sheets

(51) Int. Cl.

| | |
|---|---|
| ***H10W 90/00*** | (2026.01) |
| ***H10W 90/20*** | (2026.01) |

(56) References Cited

U.S. PATENT DOCUMENTS

| | | | | |
|---|---|---|---|---|
| 11,410,266 | B2 | 8/2022 | Matam et al. | |
| 11,444,068 | B2 | 9/2022 | Song et al. | |
| 2021/0098419 | A1 | 4/2021 | Saleh et al. | |
| 2022/0165721 | A1 | 5/2022 | Lee et al. | |
| 2022/0262766 | A1 | 8/2022 | Chen et al. | |
| 2022/0352128 | A1 | 11/2022 | Lee et al. | |
| 2022/0384374 | A1* | 12/2022 | Yu | H10W 20/023 |
| 2023/0065941 | A1* | 3/2023 | Tsai | H10P 72/74 |

* cited by examiner

1000A

1000B

1000C

1000D

1000E

1000A

SEMICONDUCTOR PACKAGE AND MANUFACTURING METHOD FOR THE SAME

CROSS-REFERENCE TO RELATED APPLICATION

This application claims priority to and the benefit of Korean Patent Application No. 10-2023-0120461, filed in the Korean Intellectual Property Office on Sep. 11, 2023, the entire contents of which are herein incorporated by reference.

BACKGROUND

(a) Field

The present disclosure relates to a semiconductor device and a fabricating method thereof.

(b) Description of the Related Art

Recently, in the semiconductor industry, chiplet technology, which is designed to overcome problems such as production cost, production difficulty, and low yield of monolithic technology that integrates various functions into one chip, is attracting attention. The chiplet technology is a technology that produces a single package by connecting several semiconductor chips with different functions to each other through high-speed interconnect.

In this case, a 3-dimensional integrated circuit (3D-IC) structure may be applied to a semiconductor package in which an upper semiconductor chip is stacked on a lower semiconductor chip in a vertical direction. For example, a 3D-IC may be manufactured by positioning a semiconductor chip having a logic function, which has a relatively large area at a lower portion of the 3D-IC, positioning a semiconductor chip having memory, analog, input/output functions, etc., which has a relatively small area at an upper portion of the 3D-IC, and molding them with an encapsulant.

In the above-described three-dimensional integrated circuit structure, heat generated from the semiconductor chip positioned at the lower portion is difficult to efficiently dissipate to an outside of the semiconductor package due to the semiconductor chip positioned at the upper portion and an encapsulant that molds it, and a heat dissipation characteristic of the semiconductor package deteriorates. Additionally, unlike the above-described structure, the placement of a logic chip in the upper portion for enhanced heat dissipation may necessitate a concurrent enhancement in the power characteristic of the logic chip.

Accordingly, a new semiconductor package that can improve the heat dissipation characteristic and the power characteristic is needed.

SUMMARY

An aspect of the present disclosure attempts to provide a semiconductor package and a manufacturing method therefor, with an improved heat dissipation characteristic.

An aspect of the present disclosure attempts to provide a semiconductor package and a manufacturing method therefor, with an improved power characteristic.

An aspect of the present disclosure attempts to provide a semiconductor package and a manufacturing method therefor, capable of ameliorating assembly yield deterioration.

An aspect of the present disclosure, a semiconductor package includes a redistribution layer structure, a first sub-package positioned on the redistribution layer structure, a second sub-package positioned on the first sub-package, and a first encapsulant positioned on the first sub-package and encapsulating the second sub-package. The first sub-package includes a first semiconductor chip including a first chip through via electrically connected to the redistribution layer structure, a second encapsulant encapsulating the first semiconductor chip, and a dielectric through via penetrating through the second encapsulant and electrically connected to the redistribution layer structure. The second sub-package includes a second semiconductor chip including a plurality of second chip through vias, each second chip through via electrically connected to one of the first chip through via and the dielectric through via, a third semiconductor chip positioned on the second semiconductor chip and electrically connected to the plurality of second chip through vias, a third encapsulant encapsulating the third semiconductor chip, and a fourth semiconductor chip positioned on the third semiconductor chip. Each of the second semiconductor chip, the third encapsulant, and the fourth semiconductor chip is exposed at a side surface of the second sub-package and covered with the first encapsulant.

According to an aspect of the present disclosure, a semiconductor package includes a redistribution layer structure, a first sub-package positioned on the redistribution layer structure, a second sub-package positioned on the first sub-package, and a first encapsulant positioned on the first sub-package and encapsulating the second sub-package. The first sub-package includes a first semiconductor chip including a first chip through via electrically connected to the redistribution layer structure, a second encapsulant encapsulating the first semiconductor chip, and a dielectric through via penetrating through the second encapsulant and electrically connected to the redistribution layer structure. The second sub-package includes a second semiconductor chip electrically connected to each of the first chip through via and the dielectric through via, and including a front surface and a rear surface, wherein the second semiconductor chip further includes: a front wiring structure positioned on the front surface, a rear wiring structure positioned on the rear surface thereof, and a second chip through via connecting the front wiring structure to the rear wiring structure, a third semiconductor chip positioned on the front surface of the second semiconductor chip and electrically connected to the second chip through via, a third encapsulant encapsulating the third semiconductor chip, and a fourth semiconductor chip positioned on the third semiconductor chip. The second semiconductor chip receives power through the first chip through via.

According to an aspect of the present disclosure, a manufacturing method of a semiconductor package includes forming a reconstituted wafer, forming a sub-package, positioning the sub-package on the reconstituted wafer, and encapsulating the sub-package with a first encapsulant. The forming of the reconstituted wafer includes preparing a first semiconductor chip including a first chip through via, encapsulating the first semiconductor chip with a second encapsulant, and forming a dielectric through via penetrating through the second encapsulant. The forming of the sub-package includes preparing a first wafer structure, wherein a front wiring structure is formed on a first surface of the first wafer structure, bonding a second semiconductor chip on the front wiring structure of the first wafer structure, encapsulating the second semiconductor chip with a third encapsulant, bonding a second wafer structure on the second semiconductor chip, forming a second chip through via in the first wafer structure to be connected to the front wiring structure, forming a rear wiring structure on a second surface, opposite to the first surface, of the first wafer structure to be connected to the second chip through via, and dicing the first wafer structure and the second wafer structure.

According to an aspect of the present disclosure, it is possible to provide a semiconductor package and a manufacturing method therefor, with an improved heat dissipation characteristic.

According to an aspect of the present disclosure, it is possible to provide a semiconductor package and a manufacturing method therefor, with an improved power characteristic.

According to an aspect of the present disclosure, it is possible to provide a semiconductor package and a manufacturing method therefor, capable of ameliorating assembly yield deterioration.

DETAILED DESCRIPTION

Figure 1:
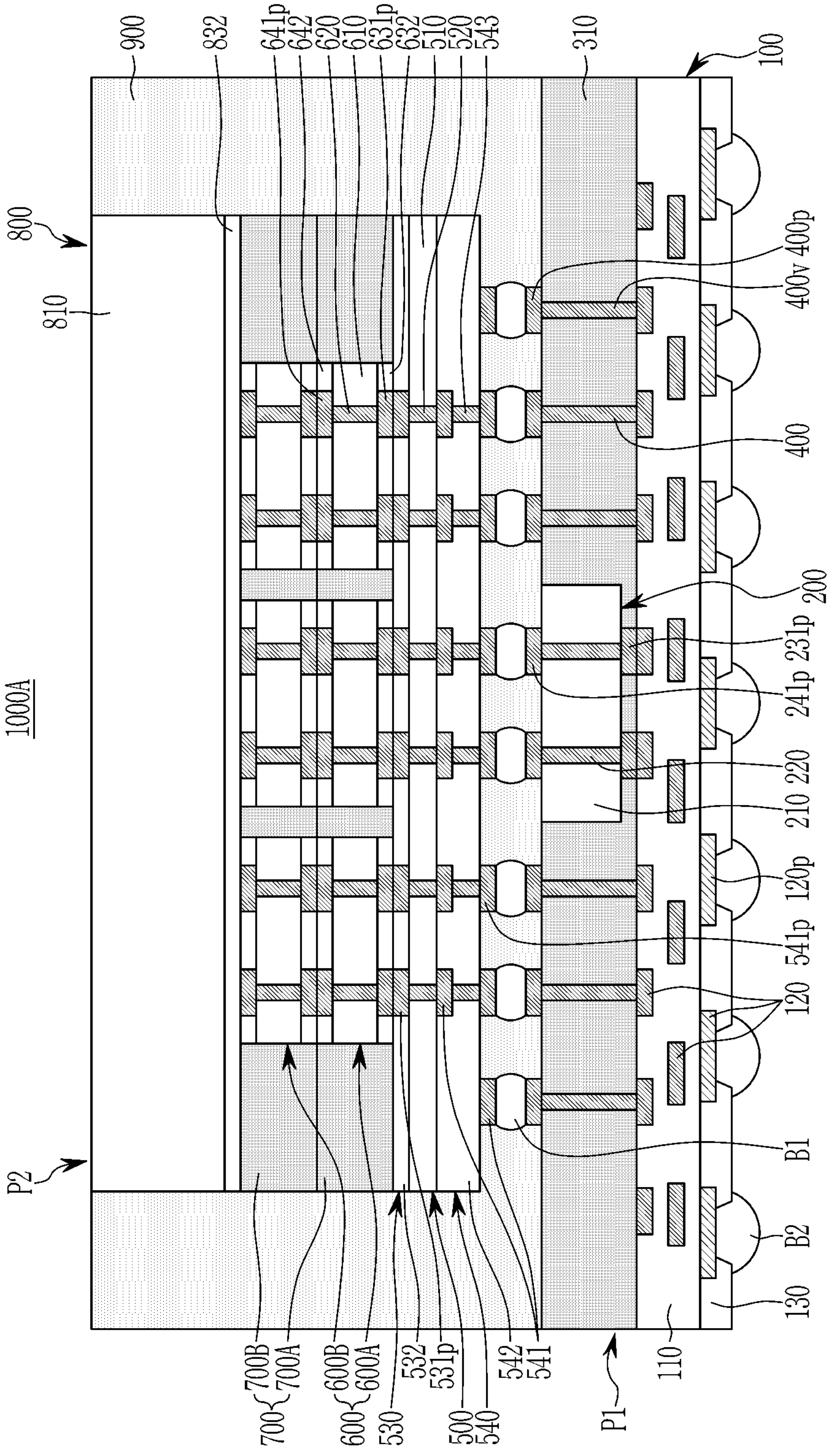
FIG. 1 illustrates a cross-sectional view of a semiconductor package according to an embodiment of the present disclosure.

The present disclosure will be described more fully hereinafter with reference to the accompanying drawings, in which embodiments of the disclosure are shown. As those skilled in the art would realize, the described embodiments may be modified in various ways, all without departing from the spirit or scope of the present disclosure.

To clearly describe the present disclosure, parts that are irrelevant to the description are omitted, and like numerals refer to like or similar constituent elements throughout the specification.

Furthermore, since sizes and thicknesses of constituent members shown in the accompanying drawings are arbitrarily given for better understanding and ease of description, the present disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

Throughout this specification and the claims that follow, when it is described that an element is "coupled/connected" to another element, the element may be "directly coupled/connected" to the other element or "indirectly coupled/connected" to the other element through a third element. In a similar sense, this includes being "physically connected" as well as being "electrically connected". In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

In addition, throughout the specification, sequence numbers such as first, second, etc. are used to distinguish a certain component from other components that are the same or similar thereto, and are not necessarily intended to refer to a specific component. Accordingly, a component referred to as a first component in a specific part of this specification may be referred to as a second component in other parts of this specification.

In addition, throughout the specification, singular references to certain elements include references to a plurality of these elements, unless specifically stated to the contrary. For example, "an insulating layer" may be used to indicate not only one wiring layer but also a plurality of insulating layers, such as two, three, or more insulating layers.

Additionally, throughout the specification, references to a first side and a second side are intended to distinguish different sides from each other, and are not necessarily intended to limit it to a specific side. Accordingly, a side referred to as a first side in a specific part of this specification may also be referred to as a second side in other parts of this specification.

Hereinafter, a semiconductor package according to embodiments of the present disclosure will be described with reference to the drawings.

In this specification, an upper side, upper surface, lower side, and lower surface will be described as referring to the upper side, upper surface, lower side, and lower surface respectively in a direction from a first sub-package P1 to a second sub-package P2 based on the drawing.

Referring to FIG. 1, the semiconductor package 1000A according to embodiments of the present disclosure includes a redistribution layer structure 100, a first sub-package P1 positioned on the redistribution layer structure 100, a second sub-package P2 positioned on the first sub-package P1, and a first encapsulant 900 positioned on the first sub-package P1 to encapsulate the second sub-package P2.

The first sub-package P1 may include a first semiconductor chip 200 including a first chip through via 220 electrically connected to the redistribution layer structure 100, a second encapsulant 310 for encapsulating the first semiconductor chip 200, and a dielectric through via 400 penetrating through the second encapsulant 310 and electrically connected to the redistribution layer structure 100.

The second sub-package P2 may include a second semiconductor chip 500 including second chip through vias 520 each electrically connected to each of the first chip through via 220 and/or the dielectric through via 400, a third semiconductor chip 600 positioned on the second semiconductor chip 500 and electrically connected to the second chip through vias 520, a third encapsulant 700 for encapsulating the third semiconductor chip, and a fourth semiconductor chip 800 positioned on the third semiconductor chip 600.

As will be described later, the second sub-package P2 may be manufactured separately from the first sub-package P1 to be positioned on the first sub-package P1, and the second semiconductor chip 500, the third encapsulant 700, and the fourth semiconductor chip 800 may each be exposed at a side surface of the second sub-package P2 to be covered with the first encapsulant 900.

In addition, the semiconductor package 1000A may further include a conductive bump B1 positioned between the first sub-package P1 and the second sub-package P2 to connect them to each other, and/or a conductive bump B2 positioned on the redistribution layer structure 100 to electrically connect the semiconductor package 1000A to other components such as a main board.

The redistribution layer structure 100 may be electrically connected to the first sub-package P1 and the second sub-package P2 connected thereto, and may be electrically connected to other components such as a main board on which the semiconductor package 1000A is positioned.

The redistribution layer structure 100 may include an insulating layer 110, a wiring layer 120, and a passivation layer 130.

The insulating layer 110 may bury and protect the wiring layer 120, and may prevent electrical short-circuiting between wiring layers 120. The insulating layer 110 may include or may be formed of a photosensitive insulating material (photo-imageable dielectric (PID)) to implement a fine pattern, but the present disclosure is not limited thereto, and may include or may be formed of a polymer such as polyimide (PI).

The wiring layer 120 may be electrically connected to each of the first semiconductor chip 200 and the dielectric through via 400. The wiring layer 120 disposed at an uppermost side of the wiring layers 120 may be exposed at a surface (i.e., an upper surface) of the insulating layer 110, and may be connected with the first semiconductor chip 200 and/or the dielectric through via 400 through direct contact. For example, the wiring layer 120 may include multi-level wirings in the insulating layer 110. The uppermost wiring of the wiring layer 120 may be exposed at an upper surface of the insulating layer 110, and may be connected to the first semiconductor chip 200 and the dielectric through via 400 through direct contact. For example, a chip pad 231*p* of the first semiconductor chip 200 contacts the uppermost wiring of the wiring layer 120. In an embodiment, the wiring layer 120 may be buried in the insulating layer 110 and may be connected to the first semiconductor chip 200 and/or the dielectric through via 400 through a via. In an embodiment, the wiring layer 120 disposed at a lowermost portion of the wiring layers 120 may include a connection pad 120*p* for electrically connecting the semiconductor package 1000A to other components. The lowermost wiring of the wiring layer 120 may include the connection pad 120*p* which electrically connects the semiconductor package 1000A to other components.

The passivation layer 130 may be disposed on the lower surface of the insulating layer 110 to protect the wiring layer 120 disposed at a lowermost side and prevent electrical short-circuiting. The passivation layer 130 may have an opening to expose the connection pad 120*p*, and the opening of the passivation layer 130 may be filled with the conductive bump B2 connected to the connection pad 120*p*. The passivation layer 130 may be a solder ball, but the present disclosure is not limited thereto.

The first semiconductor chip 200 may include a body 210, a chip through via 220, and chip pads 231*p* and 241*p*.

The first semiconductor chip 200 may have a front surface and a rear surface that is opposite to the front surface. In this specification, the front surface of the semiconductor chip may refer to an active surface, and the rear surface of the semiconductor chip may refer to an inactive surface.

The body 210 may include or may be a semiconductor substrate such as silicon (Si), germanium (Ge), gallium arsenide (GaAs), and silicon carbide (Sic), a plurality of individual devices, an internal circuit, and an interlayer insulation layer.

The chip through via 220 may penetrate through at least a portion of the body 210 in a thickness direction, and may be electrically connected to the chip pads 231*p* and 241*p*. The chip through via 220 may be directly connected with the chip pads 231*p* and 241*p* through contact, or may be indirectly connected through an internal circuit. The chip through via 220 may be electrically connected to each of the redistribution layer structure 100 and the second semiconductor chip 500 of the second sub-package P2 through the chip pads 231*p* and 241*p*.

As a method for forming the chip through via 220, a via-first, via-last, or via-middle method may be used without limitation. According to the forming method of the chip through via 220, an area of the body 210 through which the chip through via 220 penetrates may vary. Additionally, a physical vapor deposition (PVD) process, chemical vapor deposition (CVD) process, plating process, etc. may be used as a method of forming the chip through via 220. A conductive material may be used as a material for the chip through via 220, and for example, tungsten (W), copper (Cu), aluminum (Al), and doped poly silicon, etc. may be used.

The chip pads 231*p* and 241*p* may include a first chip pad 231*p* positioned on a first surface of the first semiconductor chip 200 and a second chip pad 241*p* positioned on a second surface. The first chip pad 231*p* may be positioned on a front surface of the first semiconductor chip 200, and may be a connection pad of a semiconductor chip. The second chip pad 241*p* may be positioned on a rear surface of the first semiconductor chip 200, and may be a via pad of the chip through via 220. As illustrated in the drawing, the first semiconductor chip 200 may be positioned to face down such that the front surface on which the first chip pad 231*p* is positioned faces the redistribution layer structure 100, but a rear surface of the second chip pad 241*p* may be positioned to face up the redistribution layer structure 100. The chip pads 231*p* and 241*p* may be positioned on the body 210, or at least a portion may be embedded in the body 210.

The first semiconductor chip 200 may include at least one of an input/output (I/O) circuit and an analog circuit. However, the present disclosure is not limited thereto, the first semiconductor chip 200 may include a memory circuit, etc. according to a design thereof. However, in terms of heat dissipation, it may be desirable for the first semiconductor chip 200 not to include a logic circuit that generates a lot of heat.

The second encapsulant 310 may be positioned on the redistribution layer structure 100 to encapsulate the first semiconductor chip 200. The second encapsulant 310 may cover a side surface of the first semiconductor chip 200. The chip pads 231*p* and 241*p* of the first semiconductor chip 200 may be exposed at a first surface (i.e., a lower surface) and a second surface (i.e., an upper surface) of the second encapsulant 310 for connection to other components.

The second encapsulant 310 may include or may be formed of an inorganic material. For example, the second encapsulant 310 may include or may be formed of silicon oxide, silicon nitride, or a combination thereof. In an embodiment, the second encapsulant 310 may include or may be formed of a thermosetting resin such as an epoxy resin, an epoxy molding compound (EMC), etc.

The dielectric through via 400 may penetrate through the second encapsulant 310 to connect the second sub-package P2 and the redistribution layer structure 100.

The dielectric through via 400 may include a via region 400*v* penetrating through the second encapsulant 310 and a pad region 400*p* positioned on the via region 400*v*. The pad region 400*p* of the dielectric through via 400 may be a protruding pad positioned on the second encapsulant 310 or a buried pad buried in the second encapsulant 310. The pad region 400*p* of the dielectric through via 400 may be positioned at a same level as that of the second chip pad 241*p* of the first semiconductor chip 200 for connection to the second sub-package P2.

The second semiconductor chip 500 may be positioned on the first sub-package P1 to be electrically connected to each of the first chip through via 220 and the dielectric through via 400.

The second semiconductor chip 500 may include a body 510, chip through vias 520, a front wiring structure 530 positioned on a front surface of the body 510, and a rear wiring structure 540 positioned on a rear surface of the body 510. In this case, the second semiconductor chip 500 may be positioned face up such that the front surface faces the third semiconductor chip 600 and the rear surface faces the first sub-package P1.

The body 510 may include a semiconductor substrate such as silicon (Si), germanium (Ge), gallium arsenide (GaAs), and silicon carbide (Sic), a plurality of individual devices, an internal circuit, and an interlayer insulation layer.

The chip through via 520 may penetrate through at least a portion of the body 510 in a thickness direction, and may be electrically connected to chip pads 531*p* and 541*p* of the front wiring structure 530 and the rear wiring structure 540, respectively. The chip through via 520 may be directly connected with the chip pads 531*p* and 541*p* through contact, or may be indirectly connected through an internal circuit. The chip through via 520 may be electrically connected to the third semiconductor chip 600 and the first sub-package P1 through the chip pads 531*p* and 541*p*.

As a method for forming the chip through via 520, a via-first, via-last, or via-middle method may be used without limitation. According to the forming method of the chip through via 520, an area of the body 510 through which the chip through via 520 penetrates may vary. Additionally, a PVD process, CVD process, plating process, etc. may be used as a method of forming the chip through via 520. A conductive material may be used as a material for the chip through via 520, and for example, tungsten (W), copper (Cu), aluminum (Al), and doped poly silicon, etc. may be used.

The front wiring structure 530 may include the first chip pad 531*p*, and may further include an insulating layer 532. The front wiring structure 530 may further include a wiring layer connected to an internal circuit of the body 510 and an interlayer insulating layer disposed between wiring layers, and the first chip pad 531*p* may be a connection pad connected to the wiring layer of the front wiring structure 530. This is true of other semiconductor chips 200, 600, and 800, and connection pads of the semiconductor chips 200, 600, and 800 may also be included in a front wiring structure connected to an internal circuit of each semiconductor chip.

The second semiconductor chip 500 may be electrically connected to the third semiconductor chip 600 through the first chip pad 531*p*. The second semiconductor chip 500 may be bonded with the third semiconductor chip 600 using hybrid bonding. In this case, the first chip pad 531*p* of the second semiconductor chip 500 may be bonded to the first chip pad 631*p* of the third semiconductor chip 600 by contacting the first chip pad 531*p* of the second semiconductor chip 500 to the first chip pad 631*p* of the third semiconductor chip 600. During hybrid bonding, chip pads of two adjacent semiconductor chips may be bonded through thermo-compression, and hybrid bonding may enable implementation of fine pitch, thinning of the semiconductor package, and improvement of reliability. The term "contact," as used herein, refers to a direct connection (i.e., physical touching) unless the context indicates otherwise.

An insulating layer 532 may be disposed on a side surface of the first chip pad 531*p*. For example, the insulating layer 532 may surround the side surface of the first chip pad 531*p*. In an embodiment, the second semiconductor chip 500 and the third semiconductor chip 600 are bonded using hybrid bonding. For example, the insulating layer 532 disposed on the side surface of the first chip pad 531*p* may be bonded to an insulating layer 632 disposed on a side surface of the first chip pad 631*p* of the third semiconductor chip 600 by contacting the insulating layer 532 to the insulating layer 632. However, a gap may exist between the two insulating layers 532 and 632, depending on their materials, formation methods, etc.

The rear wiring structure 540 may include a wiring layer 541, an insulating layer 542, and a via 543. In the drawing, the rear wiring structure 540 is illustrated as including a plurality of wiring layers 541, but may include a single wiring layer 541. In an embodiment, the rear wiring structure 540 may include a larger number of wiring layers 541, insulating layers 542, and/or vias 543 than illustrated in the drawing.

The wiring layer 541 of the rear wiring structure 540 may include second chip pads 541*p*. The second semiconductor chip 500 may be electrically connected to the first sub-package P1, specifically, the first semiconductor chip 200 and the dielectric through via 400 through the second chip pads 541*p*. The second chip pads 541*p* may be included in a lowermost wiring layer 541 among the wiring layers 541 of the rear wiring structure 540. The chip pad 541*p* may be a protruding pad positioned on the insulating layer 542 or a buried pad buried in the insulating layer 542.

An insulating material may be used as a material for the insulating layers 532 and 542 respectively included in the front and rear wiring structures 530 and 540. For example, the insulating layers 532 and 542 may include or may be formed of silicon oxide, silicon nitride, or polymer such as polyimide and benzocyclobutene (BCB).

The second semiconductor chip 500 may be a chip with a relatively large area that generates a lot of heat and/or has a leading edge node, and may include a logic circuit. However, the present disclosure is not limited thereto, and the second semiconductor chip 500 may include a memory circuit, an input/output circuit, an analog circuit, or the like.

As described above, the second semiconductor chip 500 may be a chip with a relatively large area that generates a lot of heat and/or has a leading node, for example, a chip including a logic circuit, and a width of the second semiconductor chip 500 may be greater than a width of each of the first semiconductor chip 200 and the third semiconductor chip 600. From a similar perspective, a length of the second semiconductor chip 500 may be longer than a length of each of the first semiconductor chip 200 and the third semiconductor chip 600. Herein, the width refers to a length in a direction that is perpendicular to a thickness direction in a cross-section view of FIG. 1, and the length refers to a length in a direction of penetrating through the cross-section view of FIG. 1.

In addition, a thickness of the second semiconductor chip 500 may be thinner than a thickness of each of the first semiconductor chip 200 and the third semiconductor chip 600. For example, a thickness of the first semiconductor chip 200 may be more than 5 times greater than the thickness of the second semiconductor chip 500. As will be described later, a thickness of a wafer structure for manufacturing the second semiconductor chip 500 may be reduced by grinding and accordingly, a signal transfer path and resistance of the second semiconductor chip 500 may be reduced.

The second semiconductor chip 500 may receive power through the first chip through via 220. Specifically, the second semiconductor chip 500 may receive power through the first chip through via 220 and the rear wiring structure 540 of the second semiconductor chip 500. Accordingly, the semiconductor package 1000A according to the present disclosure may form the rear wiring structure 540 for power supply by using not only a front surface of the second semiconductor chip 500 but also a rear surface of the second semiconductor chip 500 for electrical wiring, thereby smoothly supplying power to the second semiconductor chip 500, and reducing a wiring density of the front wiring structure 530 and increasing a wiring freedom. For example, the front wiring structure 530 could be used for signal transmission, and the rear wiring structure 540 could be used for power supply.

In addition, the second semiconductor chip 500 may also receive power through the dielectric through via 400. The dielectric through via 400 may supply power to the second semiconductor chip 500 together with the first chip through via 220. Specifically, the dielectric through via 400 may also supply power to the second semiconductor chip 500 through the rear wiring structure 540 of the second semiconductor chip 500. In this case, power may be supplied uniformly to an entire area of the second semiconductor chip 500 by including an area of the second semiconductor chip 500 where it is difficult to receive power through the first chip through via 220 due to a difference in width between the first semiconductor chip 200 and the second semiconductor chip 500, thereby more efficiently improving a power characteristic of the second semiconductor chip 500.

The third semiconductor chip 600 may be positioned between the second semiconductor chip 500 and the fourth semiconductor chip 800, and may be electrically connected to the second semiconductor chip 500. In an embodiment, the third semiconductor chip 600 may also be electrically connected to the fourth semiconductor chip 800.

The third semiconductor chip 600 may include a plurality of third semiconductor chips 600A and 600B stacked in a vertical direction. In addition, the third semiconductor chip 600 may include a plurality of third semiconductor chips 600 positioned to be spaced apart from each other in a horizontal direction. For example, as illustrated in the drawing, the third semiconductor chip 600 may include a plurality of third semiconductor chips 600A positioned to be spaced apart from each other on the second semiconductor chip 500 and a plurality of third semiconductor chips 600B positioned on the respective third semiconductor chips 600A.

The third semiconductor chip 600 may include a body 610, a chip through via 620, chip pads 631*p* and 641*p*, and insulating layers 632 and 642.

The third semiconductor chip 600 includes a plurality of third semiconductor chips 600A and 600B stacked in the vertical direction, and the third semiconductor chips 600A, and 600B may each include the body 610, the chip through via 620, the chip pads 631*p* and 641*p*, and the insulating layers 632 and 642. In an embodiment, at least one of the third semiconductor chips 600A and 600B may include the body 610, the chip through via 620, the chip pads 631*p* and 641*p*, and the insulating layers 632 and 642. For example, as will be described later, the fourth semiconductor chip 800 may be a dummy chip, and in this case, the third semiconductor chip 600B positioned on an uppermost surface of the third semiconductor chips 600A and 600B may not include the chip through via 620 and the chip pad 641*p* for electrical connection with the fourth semiconductor chip 800, and the insulating layer 642 for hybrid bonding. As used herein, the term "dummy" is used to refer to a component that has the same or similar structure and shape as other components but does not have a substantial function and exists only as a pattern in the device.

The body 610 may include a semiconductor substrate such as silicon (Si), germanium (Ge), gallium arsenide (GaAs), and silicon carbide (Sic), a plurality of individual devices, an internal circuit, and an interlayer insulation layer.

The chip through via 620 may penetrate through at least a portion of the body 610 in a thickness direction, and may be electrically connected to the chip pads 631*p* and 641*p*. The chip through via 620 may be directly connected with the chip pads 631*p* and 641*p* through contact, or may be indirectly connected through an internal circuit. The chip through via 620 may also be electrically connected to the second semiconductor chip 500 and the fourth semiconductor chip 800 through chip pads 631*p* and 641*p* respectively. In addition, the third semiconductor chips 600A and 600B stacked in the vertical direction may be electrically connected with each other through the chip through via 620.

As a method for forming the chip through via 620, a via-first, via-last, or via-middle method may be used without limitation. According to the forming method of the chip through via 620, an area of the body 610 through which the chip through via 620 penetrates may vary. Additionally, a PVD process, CVD process, plating process, etc. may be used as a method of forming the chip through via 620. A conductive material may be used as a material for the chip through via 620, and for example, tungsten (W), copper (Cu), aluminum (Al), and doped poly silicon, etc. may be used.

The chip pads 631*p* and 641*p* may include a first chip pad 631*p* positioned on a first surface of the third semiconductor chip 600 and a second chip pad 641*p* positioned on a second surface. The first chip pad 631*p* may be positioned on a front surface of the third semiconductor chip 600, and may be a connection pad of a semiconductor chip. The second chip pad 641*p* may be positioned on a rear surface of the third semiconductor chip 600, and may be a via pad of the chip through via 620. The third semiconductor chip 600 may be positioned to face down such that a front surface where a connection pad is positioned faces the second semiconductor chip 500, but on the contrary, it may be positioned to face up. The chip pads 631*p* and 641*p* may be positioned on the body 610, or at least a portion of each of the chip pads 631*p* and 641*p* may be embedded in the body 610.

The first insulating layer 632 and the second insulating layer 642 may be respectively disposed on side surfaces of the first chip pad 631*p* and the second chip pad 641*p*. In an embodiment, the second semiconductor chip 500 and the third semiconductor chip 600 are bonded using hybrid bonding. For example, the first insulating layer 632 may be bonded to the insulating layer 532 of the front wiring structure 530 of the second semiconductor chip 500 by contacting the first insulating layer 632 to the insulating layer 532. Similarly, the third semiconductor chips 600A and 600B are bonded using hybrid bonding, and the second insulating layer 642 of the third semiconductor chip 600A disposed on a lower surface may be contacted and bonded to the first insulating layer 632 of the third semiconductor chip 600B disposed on an upper surface. However, a gap may exist between the two insulating layers 632 and 642 to be hybrid bonded depending on their materials, formation methods, etc.

Meanwhile, as described above, the third semiconductor chip 600B disposed on the upper surface of the first insulating layer 632 may not include the through via 620, the chip pad 641*p*, and the second insulating layer 642, and a bonding method of the third semiconductor chip 600B and the fourth semiconductor chip 800, including this case, will be described later in a description of the fourth semiconductor chip 800.

The third semiconductor chip 600 may include a memory circuit such as static random access memory (SRAM). The third semiconductor chip 600 includes the semiconductor chips 600A and 600B stacked on each other to increase memory capacity. The third semiconductor chip 600 may be a high bandwidth memory (HBM) chip including a plurality of memory chips. However, the present disclosure is not limited thereto, and the third semiconductor chip 600 may include a logic circuit, an input/output circuit, an analog circuit, or the like. In an embodiment, the third semiconductor chip 600 may be a dummy chip.

The third encapsulant 700 may protect the third semiconductor chip 600. The third encapsulant 700 may cover a side surface of the third semiconductor chip 600, but the chip pads 631*p* and 641*p* of the third semiconductor chip 600 may not be covered for connection between the third semiconductor chip 600, the second semiconductor chip 500, and the fourth semiconductor chip 800.

The third semiconductor chip 600 includes the third semiconductor chips 600A and 600B, and the third encapsulant 700 may include a plurality of third encapsulants 700A and 700B that encapsulates each of the third semiconductor chips 600A and 600B. The third encapsulants 700A and 700B may respectively encapsulate the third semiconductor chips 600A and 600B, and a boundary between the third encapsulants 700A and 700B may or may not exist therebetween.

The third encapsulant 700 may include or may be formed of an inorganic material. For example, the third encapsulant 700 may include or may be formed of silicon oxide, silicon nitride, or a combination thereof. As will be described later, the third semiconductor chip 600 may be positioned on a wafer structure for manufacturing the second semiconductor chip 500, after being encapsulated with the third encapsulant 700, the rear wiring structure 540 of the second semiconductor chip 500 may be formed, and a process of forming the rear wiring structure 540 may be carried out at a high temperature. In an embodiment, it may be desirable to form the third encapsulant 700 of an inorganic material to prevent deformation of a material. For example, the third encapsulant 700 of an inorganic material may serve to prevent the deformation of the semiconductor package 1000A.

The fourth semiconductor chip 800 may be positioned on the third semiconductor chip 600, and may extend to be positioned on the third encapsulant 700.

The fourth semiconductor chip 800 may serve as a supporting member in a case of forming the rear wiring structure 540 of the second semiconductor chip 500. The fourth semiconductor chip 800 is not limited thereto, but may be a dummy chip. The fourth semiconductor chip 800 is a dummy chip, and a body 810 of the fourth semiconductor chip 800 may include a semiconductor substrate without including an individual device, an internal circuit, an interlayer insulating film, and the like.

The fourth semiconductor chip 800 may be fusion-bonded with the third semiconductor chip 600. In a case of being bonded by fusion bonding, the body 810 of the fourth semiconductor chip 800 may be directly bonded to the body 610 of the third semiconductor chip 600 through a high-temperature heat treatment process.

In an embodiment, the fourth semiconductor chip 800 may be bonded with the third semiconductor chip 600 using polymer adhesive. An insulating layer 832 may be additionally disposed between the third semiconductor chip 600, the third encapsulant 700, and the fourth semiconductor chip 800 for coupling, and the fourth semiconductor chip 800 may be bonded with the third semiconductor chip 600 through the insulating layer 832. In this specification, the insulating layer 832 is described as a component included in the fourth semiconductor chip 800.

For the insulating layer 832, e.g., silicon oxide, silicon nitride or benzocyclobutene (BCB), poly(arylene ether) (PAE), poly(p-phenyleneBenzobioxazole) (PBO), or thermosetting polymer such as SU-8 (epoxy) may be used.

Figure 13:
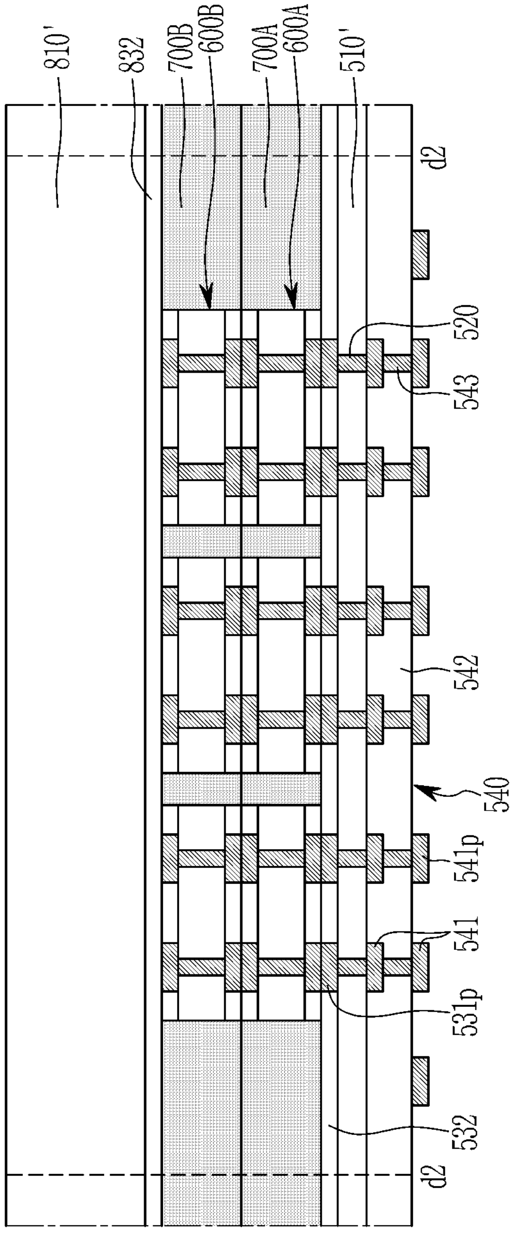
Figure 14:
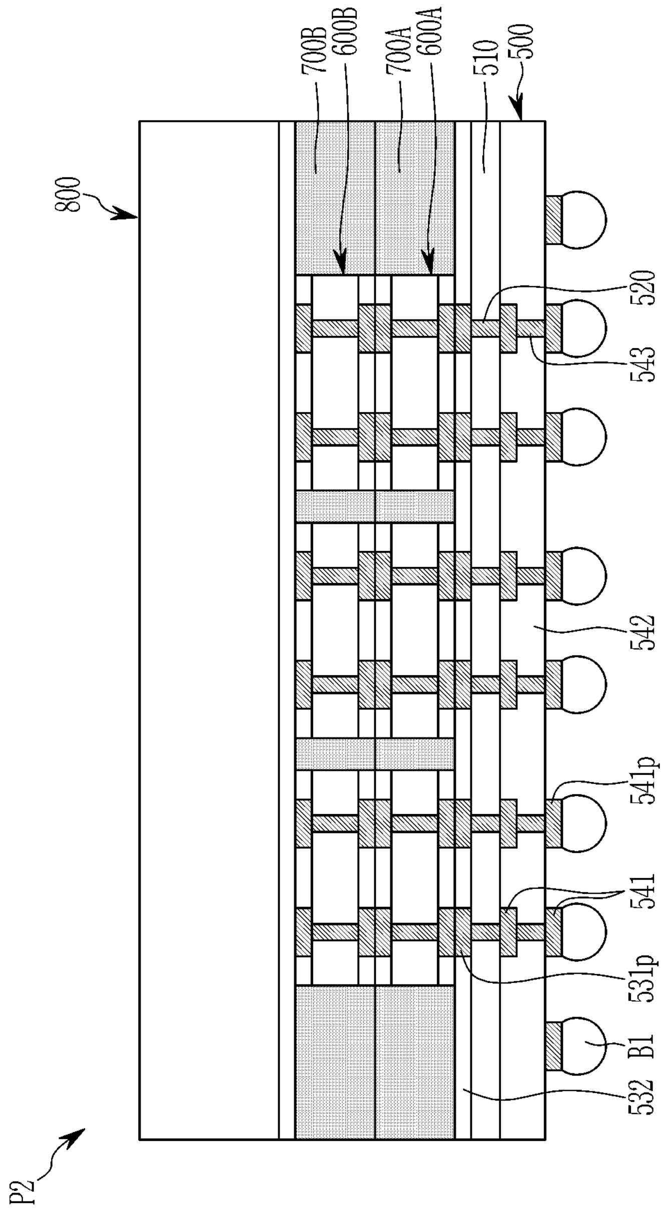
Figure 15:
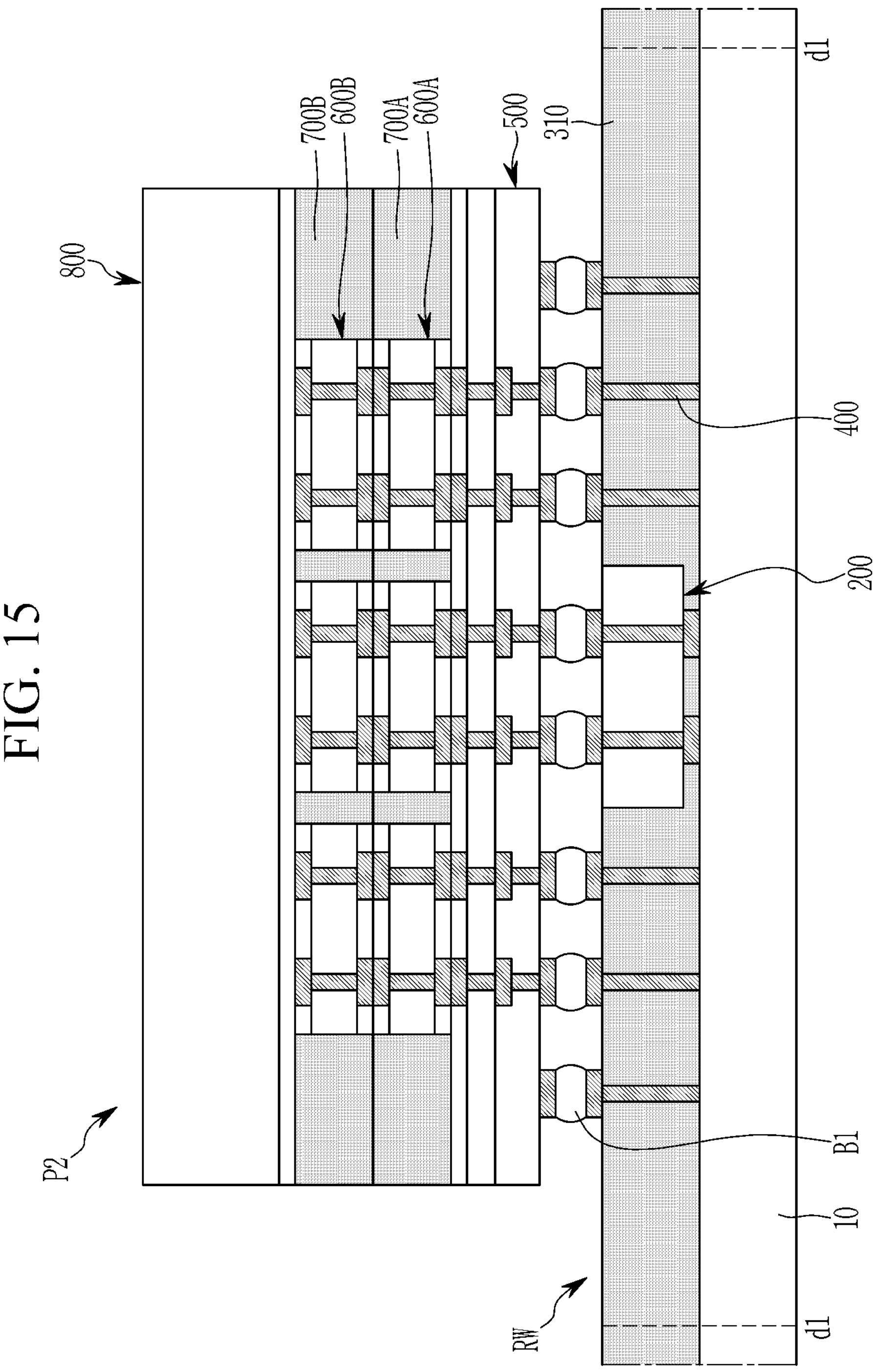
Figure 16:
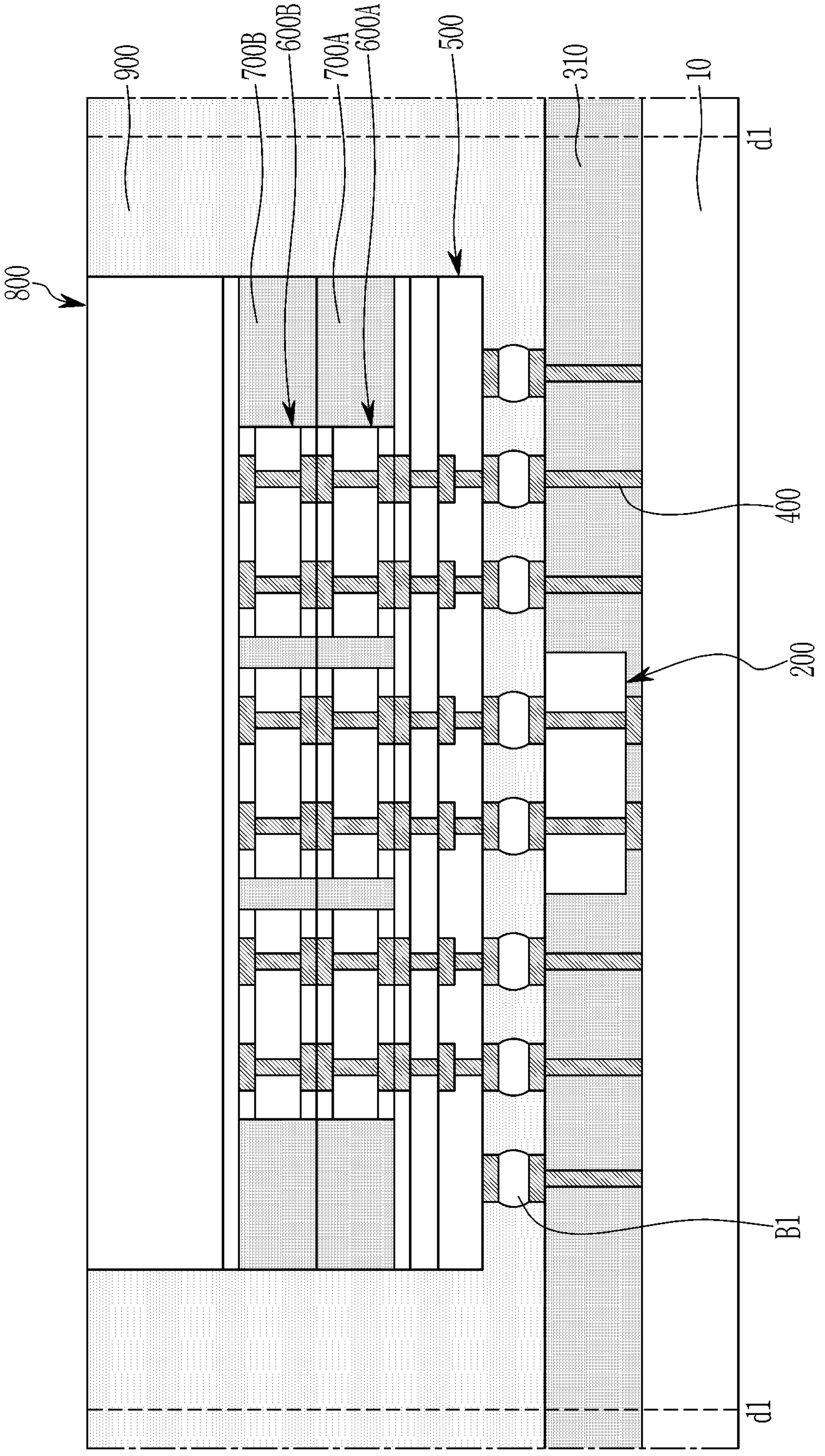
Figure 17:
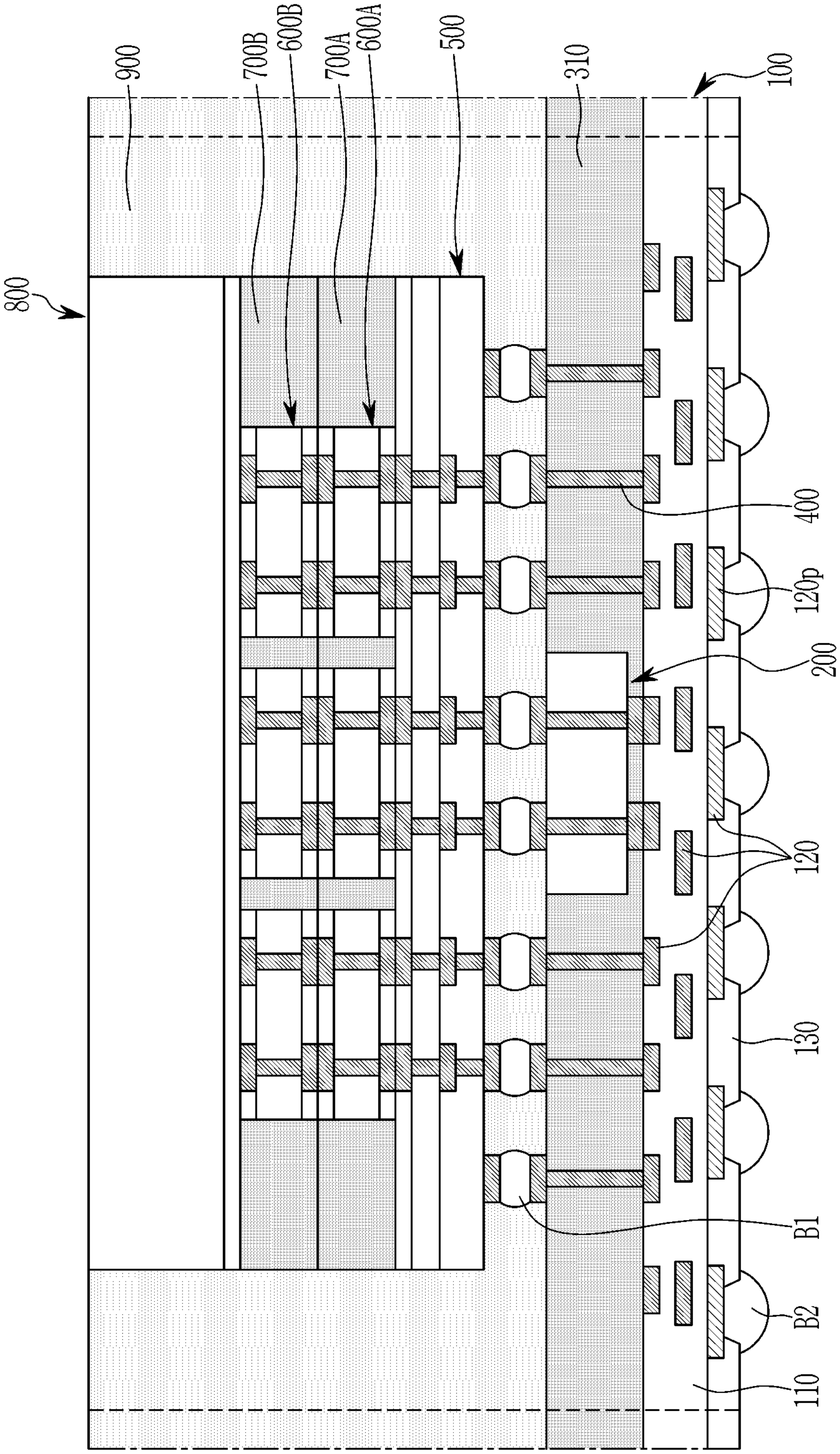
Figure 18:
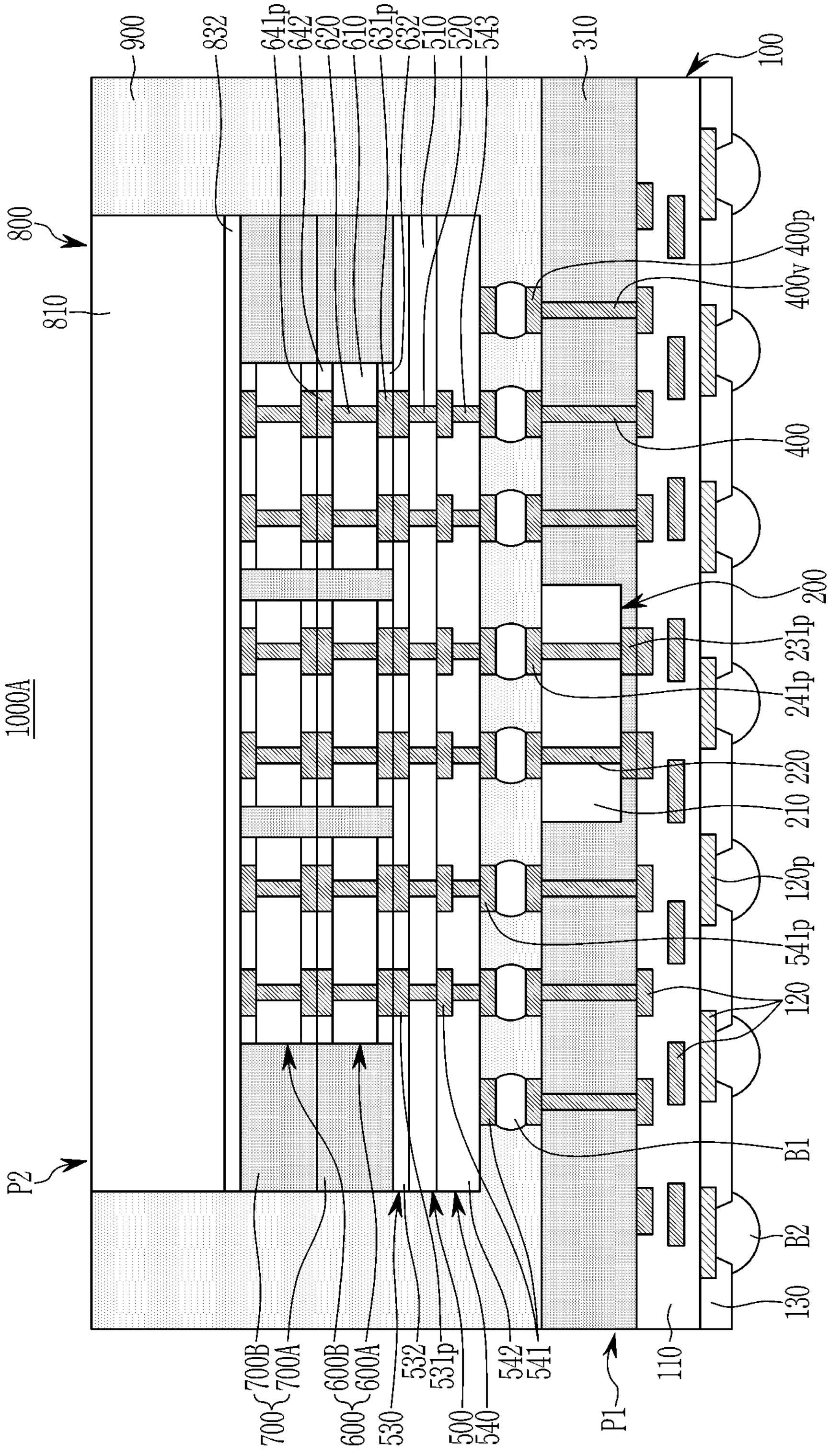

As shown in FIG. 13, a wafer structure 810' for manufacturing the fourth semiconductor chip 800 may be diced together with a wafer structure 510' for manufacturing the second semiconductor chip 500. Accordingly, a width and a length of the fourth semiconductor chip 800 may be the same as those of the second semiconductor chip 500.

A first encapsulant 900 may cover side surfaces of the second sub-package P2, and may further cover a lower surface thereof. The first encapsulant 900 may not cover upper surface of the second sub-package P2, and thus the fourth semiconductor chip 800 may be exposed at one surface of the first encapsulant 900 (i.e., an upper surface of the first encapsulant 900). In an embodiment, an upper surface of the fourth semiconductor chip 800 may be coplanar with the upper surface of the first encapsulant 900. Through this structure, the semiconductor package 1000A may have a better heat dissipation characteristic.

The first encapsulant 900 may include or may be formed of an organic material. For example, the first encapsulant

900 may include or may be formed of polyimide (PI) such as photosensitive polyimide (PSPI), epoxy, an epoxy mold compound (EMC), etc.

The semiconductor package 1000A according to an embodiment of the present disclosure may improve the heat dissipation characteristic by positioning the second semiconductor chip 500, which generates a lot of heat and has a large area, in the second sub-package P2, which is an upper package, In this case, the third semiconductor chip 600, the third encapsulant 700 made of a material with high thermal conductivity such as silicon oxide, and the fourth semiconductor chip 800 may be disposed on the second semiconductor chip 500, and heat generated in the semiconductor package may be efficiently dissipated to an upper side of the semiconductor package 1000A through these components.

In addition, the semiconductor package 1000A may improve power characteristics such as power integrity (PI) by forming the rear wiring structure 540 on the second semiconductor chip 500 and supplying power thereto. In this case, a manufacturing cost of the semiconductor package may be minimized by applying a legacy process to the other semiconductor chips 200, 600, and 800 without forming a rear wiring structure. The power integrity refers to the ability of the semiconductor package 1000A to properly deliver and distribute power to its constituent chips without experiencing voltage drops, noise, or other disturbances that could affect the package's functionality. It involves ensuring stable and clean power supply, minimizing voltage fluctuations, and managing electromagnetic interference (EMI) to maintain reliable operation of the semiconductor package 1000A.

In addition, the semiconductor package 1000A may form the second sub-package P2 by separately packaging the second to fourth semiconductor chips 500, 600, and 800, and deterioration of an assemble yield may be reduced by selecting known good products and positioning them on the first sub-package P1 using a reconstituted wafer technology, and by repackaging them. The reconstituted wafer technology involves a process where individual semiconductor dies (chips) are removed from their original wafers, then rearranged and bonded onto a new substrate to form a new integrated circuit (IC) package.

Figure 2:
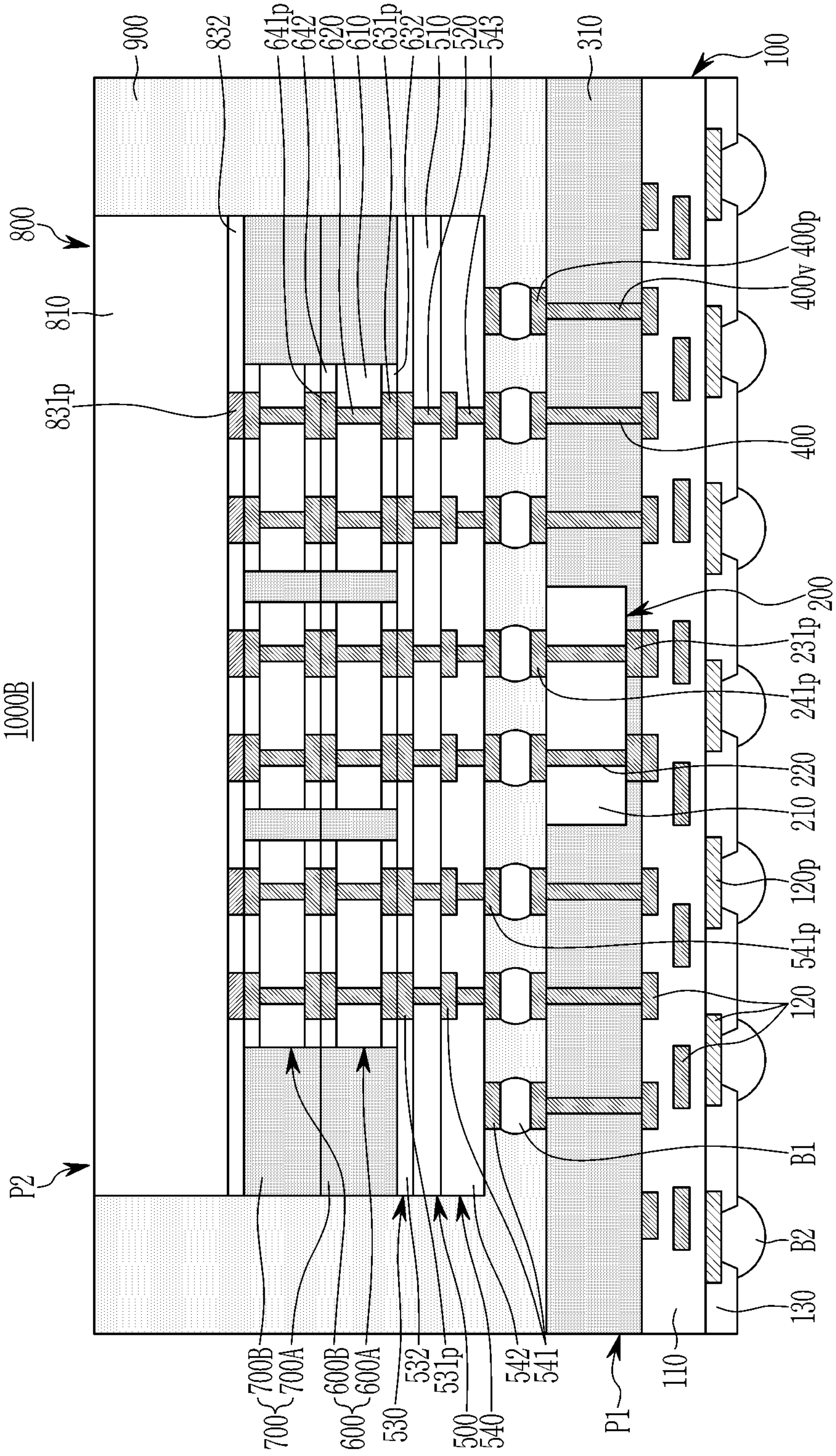
FIG. 2 illustrates a cross-sectional view of a semiconductor package according to an embodiment of the present disclosure.

FIG. 2 illustrates a cross-sectional view of a semiconductor package according to an embodiment of the present disclosure.

Referring to the drawing, the fourth semiconductor chip 800 of semiconductor package 1000B may further include a chip pad 831*p*.

The fourth semiconductor chip 800 may not be a dummy chip, and may include, e.g., an input/output (I/O) circuit, an analog circuit, a memory circuit, etc.

The body 810 may further include a plurality of individual elements, an internal circuit, and an interlayer insulating film in addition to a semiconductor substrate.

The chip pad 831*p* may be a connection pad positioned on a front surface of the fourth semiconductor chip 800. The fourth semiconductor chip 800 may be positioned to face down such that a front surface where the chip pad 831*p* is positioned faces the third semiconductor chip 600. The chip pad 831*p* may be positioned on the body 810, or at least a portion of the chip pad 831*p* may be embedded in the body 210.

The fourth semiconductor chip 800 may be bonded with the third semiconductor chip 600B using hybrid bonding. In this case, the chip pad 831*p* may be bonded to a second chip pad 641*p* of the third semiconductor chip 600B by contacting the chip pad 831*p* to the second chip pad 641*p*. In addition, the insulating layer 832 disposed on a side surface of the chip pad 831*p* may be bonded to the second insulating layer 642 of the third semiconductor chip 600B by contacting the insulating layer 832 to the second insulating layer 642. However, a gap may exist between the two insulating layers 832 and 642, depending on their materials, formation methods, etc.

A description of other components is the same as that specifically described in the description of the semiconductor package 1000A according to an embodiment of the present disclosure, and thus the detailed description of these components will be omitted.

Figure 3:
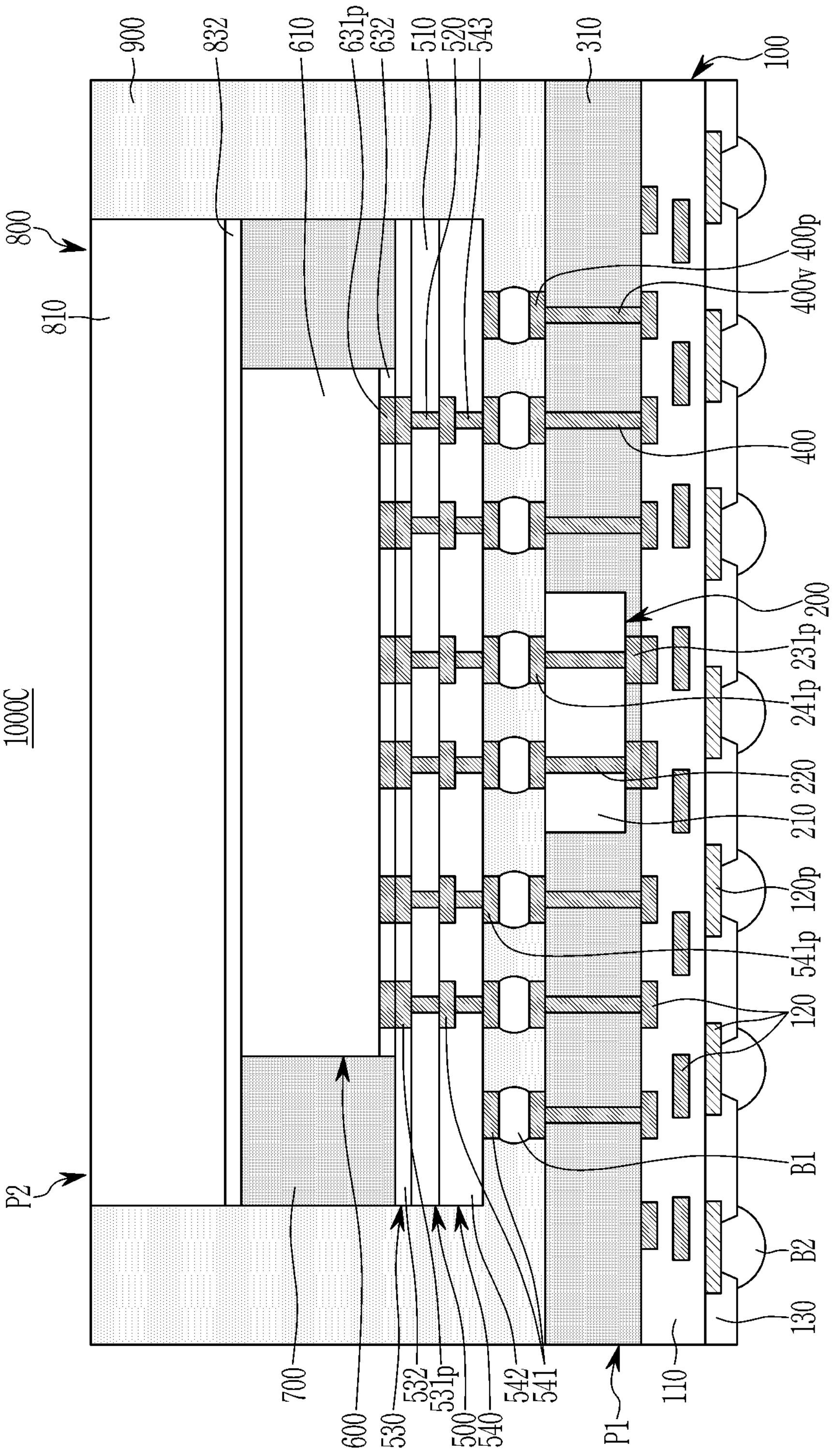
FIG. 3 illustrates a cross-sectional view of a semiconductor package according to an embodiment of the present disclosure.

FIG. 3 illustrates a cross-sectional view of a semiconductor package according to an embodiment of the present disclosure.

Referring to the drawing, the third semiconductor chip 600 of the semiconductor package 1000C may be a singular third semiconductor chip 600.

In this case, the fourth semiconductor chip 800 is a dummy chip. The third semiconductor chip 600 may include the body 610, the first chip pad 631*p*, and the first insulating layer 632. The third semiconductor chip 600 may not include the chip through via 620, the second chip pad 641*p*, and the second insulating layer 642 for connection to the fourth semiconductor chip 800. However, in an embodiment, the third semiconductor chip 600 may include the chip through via 620, the second chip pad 641*p*, and the second insulation layer 642.

A description of other components is the same as that specifically described in the description of the semiconductor package 1000A according to an embodiment of the present disclosure, and thus the detailed description of these components will be omitted.

Figure 4:
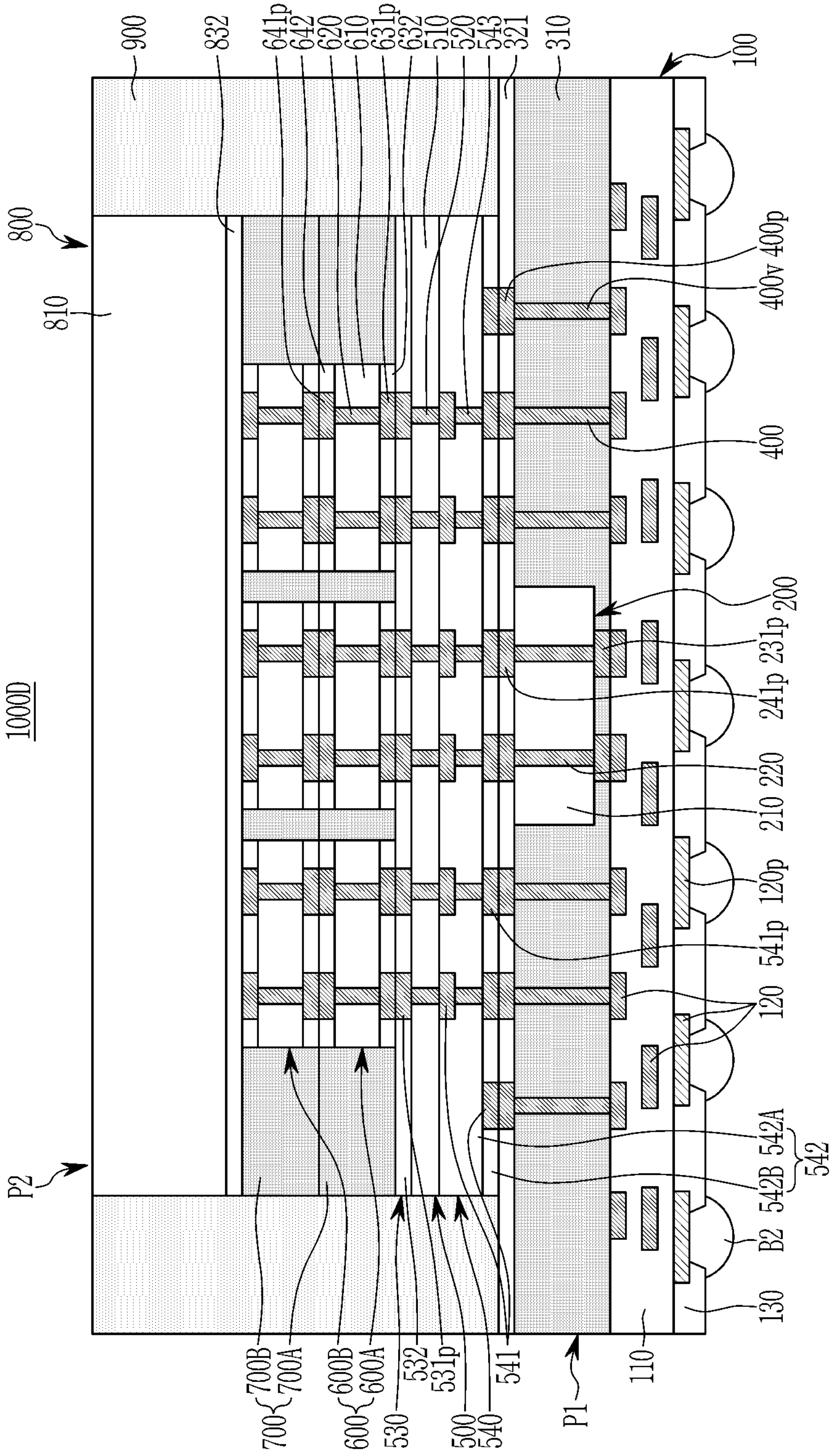
FIG. 4 illustrates a cross-sectional view of a semiconductor package according to an embodiment of the present disclosure.

FIG. 4 illustrates a cross-sectional view of a semiconductor package according to an embodiment of the present disclosure.

Referring to the drawing, in the semiconductor package 1000D, the second semiconductor chip 500 and the first sub-package P1 may be bonded using hybrid bonding. In this case, each of the chip pads 541*p* of the second semiconductor chip 500 may be bonded to one of the chip pad 241*p* of the first semiconductor chip 200 and the pad region 400*p* of the dielectric through via 400 by contacting each of the chip pads 541*p* to one of the chip pad 241*p* and the pad region 400*p*.

The first sub-package P1 may further include an insulation layer 321 disposed on the second chip pad 241*p* of the first semiconductor chip 200 and a side surface of the pad region 400*p* of the dielectric through via 400. The insulating layer 321 may have a boundary with the second encapsulant 310. In an embodiment, the insulating layer 321 may be integrated with the second encapsulant 310, and may not have a boundary therebetween.

In addition, the rear wiring structure 540 of the second semiconductor chip 500 may further include an insulating layer 542B disposed on a side surface of the chip pad 541*p* in addition to an insulating layer 542A disposed between the wiring layers 541. The insulating layers 542A and 542B of the rear wiring structure 540 may have a boundary therebetween. In an embodiment, the insulating layers 542A and 542B may be formed integrally with each other without having a boundary therebetween. In an embodiment, the chip pad 541*p* is a buried pad buried in the insulating layer 542A, and the additional insulating layer 542B may not be necessary.

The insulating layer 542B disposed on the side surface of the chip pad 541*p* may be bonded to the chip pad 241*p* of the first semiconductor chip 200 and the insulating layer 321 disposed on the side surface of the pad region 400*p* of the dielectric through via 400 by contacting the insulating layer 542B to the chip pad 241*p* and the insulating layer 321. However, a gap may exist between the two insulating layers 542B and 321, depending on their materials, formation methods, etc.

The insulating layers 321 and 542B for hybrid bonding may include or may be formed of an inorganic material such as silicon oxide and silicon nitride, or polymer such as polyimide (PI) and benzocyclobutene (BCB).

A description of other components is the same as that specifically described in the description of the semiconductor package 1000A according to an embodiment of the present disclosure, and thus the detailed description of these components will be omitted.

Figure 5:
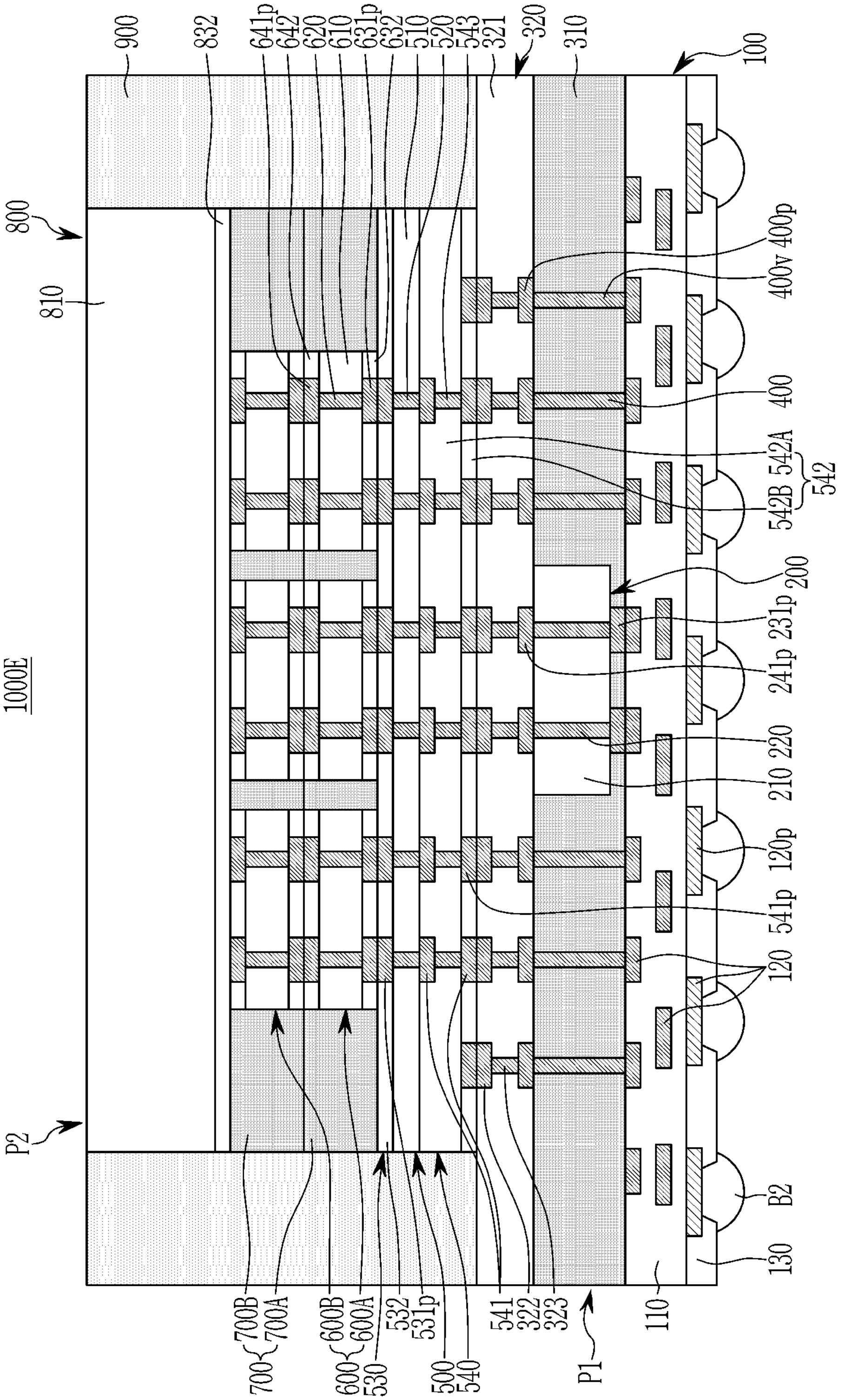
FIG. 5 illustrates a cross-sectional view of a semiconductor package according to an embodiment of the present disclosure.

FIG. 5 illustrates a cross-sectional view of a semiconductor package according to an embodiment of the present disclosure.

Referring to the drawing, in the semiconductor package 1000E, the first sub-package P1 may further include a bonding layer 320 disposed on the second encapsulant 310. The bonding layer 320 may include the insulating layer 321, a bonding pad 322 exposed at one surface (i.e., an upper surface) of the insulating layer 321, and a via 323 penetrating through the insulating layer 321. The via 323 may connect the bonding pad 322 to one of the first semiconductor chip 200 and the dielectric through via 400. The via 323 may contact the pad region 400*p* of the dielectric through via 400. In an embodiment, the dielectric through via 400 does not include the pad region 400*p*, and the via 323 may contact the via region 400*v*.

Even in the semiconductor package 1000E, the second semiconductor chip 500 and the first sub-package P1 may be bonded using hybrid bonding. In this case, the chip pad 541*p* of the second semiconductor chip 500 may be bonded to the bonding pad 322 of the bonding layer 320 by contacting the chip pad 541*p* to the bonding pad 322. In addition, the insulating layer 542B disposed on a side surface of the chip pad 541*p* may be bonded to the insulation layer 321 of the bonding layer 320 by contacting the insulating layer 542B to the insulation layer 321. However, a gap may exist between the two insulating layers 542B and 321, depending on their materials, formation methods, etc.

A description of other components is the same as that specifically described in the description of the semiconductor package 1000A according to an embodiment of the present disclosure, and thus the detailed description of these components will be omitted.

Figure 6:
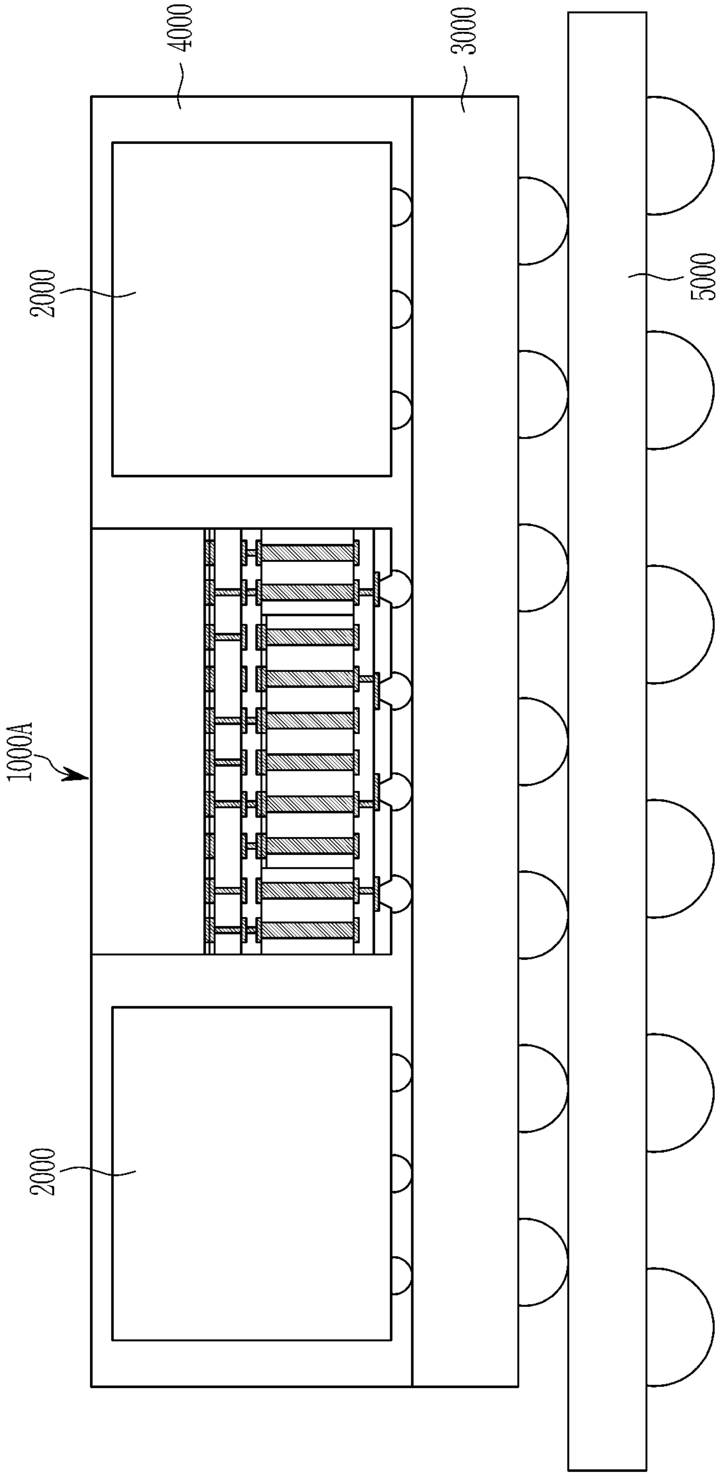
FIG. 6 illustrates a 2.5D package including a semiconductor package according to an embodiment of the present disclosure.

Referring to FIG. 6, a 2.5D package may include the semiconductor package 1000A according to an embodiment of the present disclosure.

For example, the 2.5D package may be formed by positioning the semiconductor package 1000A and a memory chip 2000 side by side on an interposer substrate 3000 and encapsulating them with an encapsulant 4000. The memory chip 2000 may be a high bandwidth memory (HBM), and a plurality of memory chips 2000 may be mounted on the interposer substrate 3000. The 2.5D package may be mounted on a main board 5000, etc.

Of course, the 2.5D package may include semiconductor packages 1000B and 1000C according to an embodiment of the present disclosure.

Figure 7:
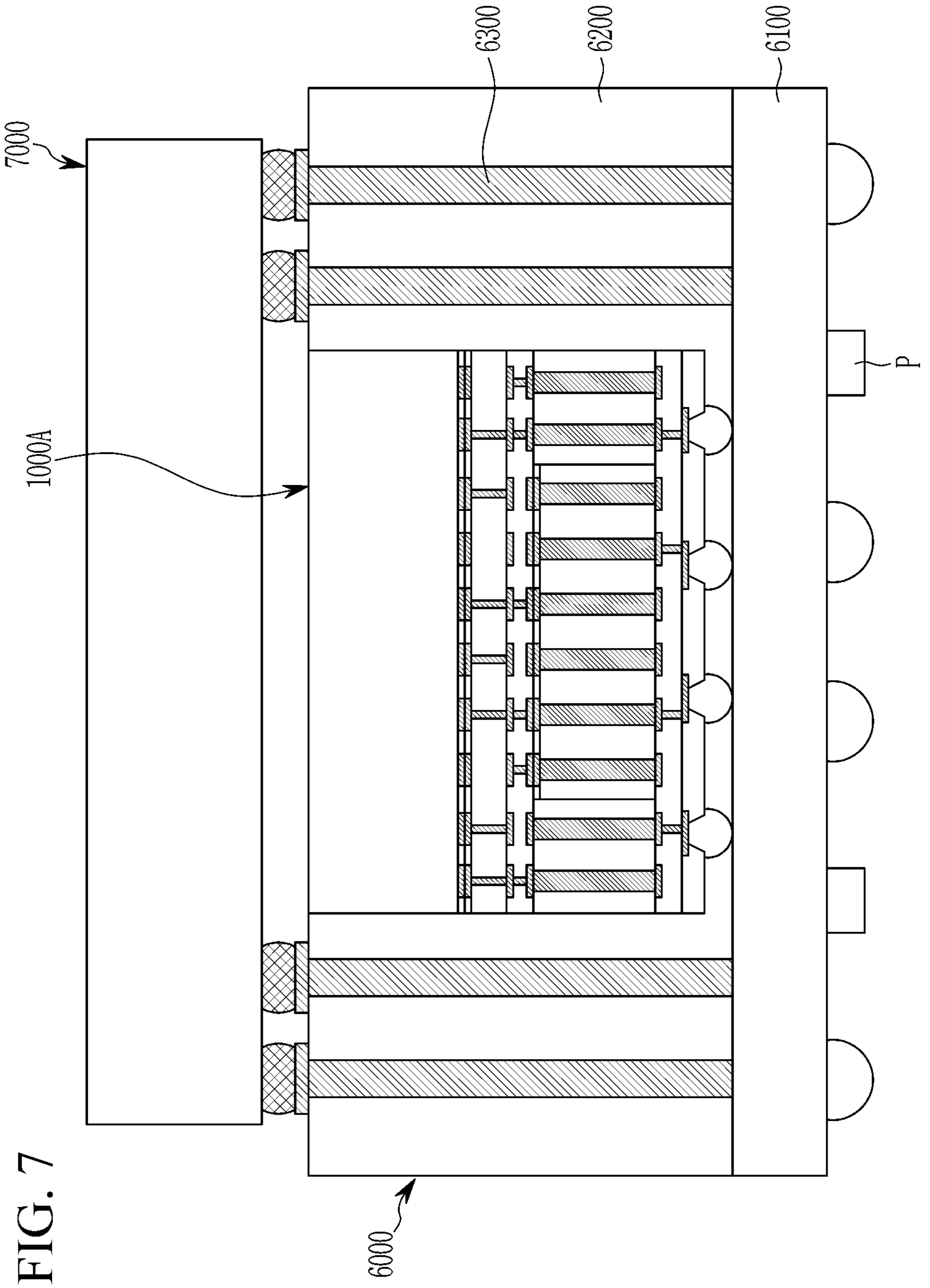
FIG. 7 illustrates a cross-sectional view of a package on package (POP) including a semiconductor package according to an embodiment of the present disclosure.

Referring to FIG. 7, a package on package (POP) may include the semiconductor package 1000A according to an embodiment of the present disclosure.

For example, the package on package may be manufactured by positioning the semiconductor package 1000A on a substrate 6100 and encapsulating it with an encapsulant 6200 to manufacture a lower semiconductor package 6000, and then mounting an upper semiconductor package 7000 on the lower semiconductor package 6000. The upper semiconductor package 7000 may be electrically connected to the substrate 6100 of the lower semiconductor package 6000 through a conductive post 6300. A passive component P such as a capacitor may be additionally positioned on a lower surface of the substrate 6100 along with a solder ball.

The package on package may include semiconductor packages 1000B and 1000C according to an embodiment of the present disclosure.

FIG. 8 to FIG. 18 schematically illustrate a schematic manufacturing process diagram of a semiconductor package according to an embodiment of the present disclosure.

Referring to the drawing, a manufacturing method of the semiconductor package according to an embodiment of the present disclosure may include forming a reconstituted wafer RW, forming the sub-package P2, positioning the sub-package P2 on the reconstituted wafer RW, and encapsulating the sub-package P2 with the first encapsulant 900. In a description of the manufacturing method for the semiconductor package, the sub-package P2 refers to the second sub-package P2 of the semiconductor package 1000A. The reconstituted wafer RW may be a wafer with individual semiconductor dies (chips) which are removed from their original wafers, and then rearranged and bonded onto the wafer as a new substrate using a reconstituted wafer technology.

In addition, the manufacturing method for the semiconductor package may further include forming the redistribution layer structure 100 electrically connected to each of the first semiconductor chip 200 and the dielectric through via 400 on the reconstituted wafer RW. The first sub-package P1 of the semiconductor package 1000A may be manufactured by forming the redistribution layer structure 100 on the reconstituted wafer RW and dicing the reconstituted wafer RW along a first dicing line d1.

Figure 8:
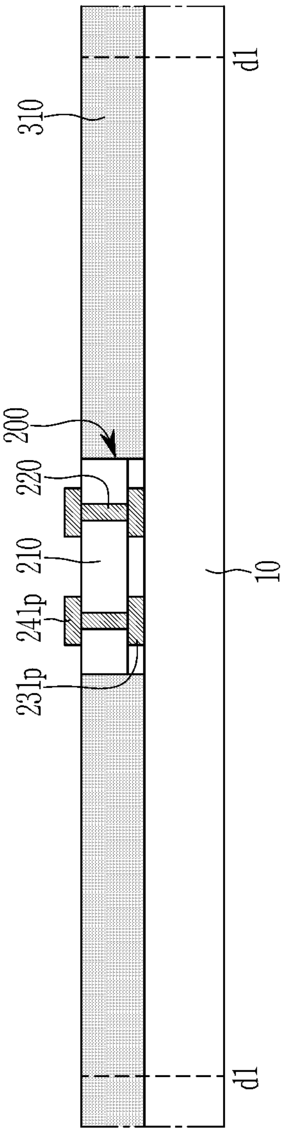
FIG. 8 to FIG. 18 schematically illustrate a schematic manufacturing process diagram of a semiconductor package according to an embodiment of the present disclosure.
Figure 9:
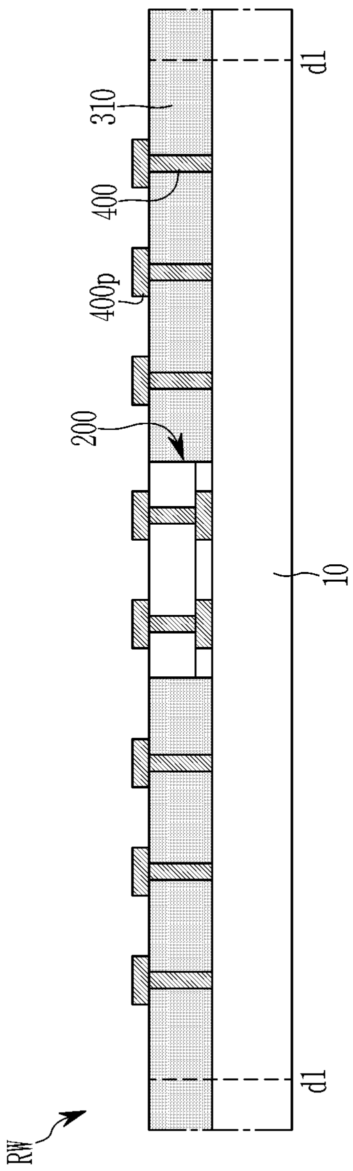
Figure 10:
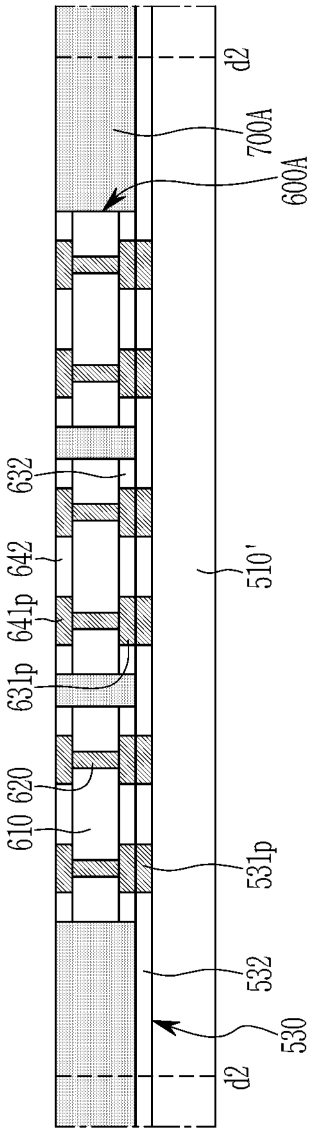
Figure 11:
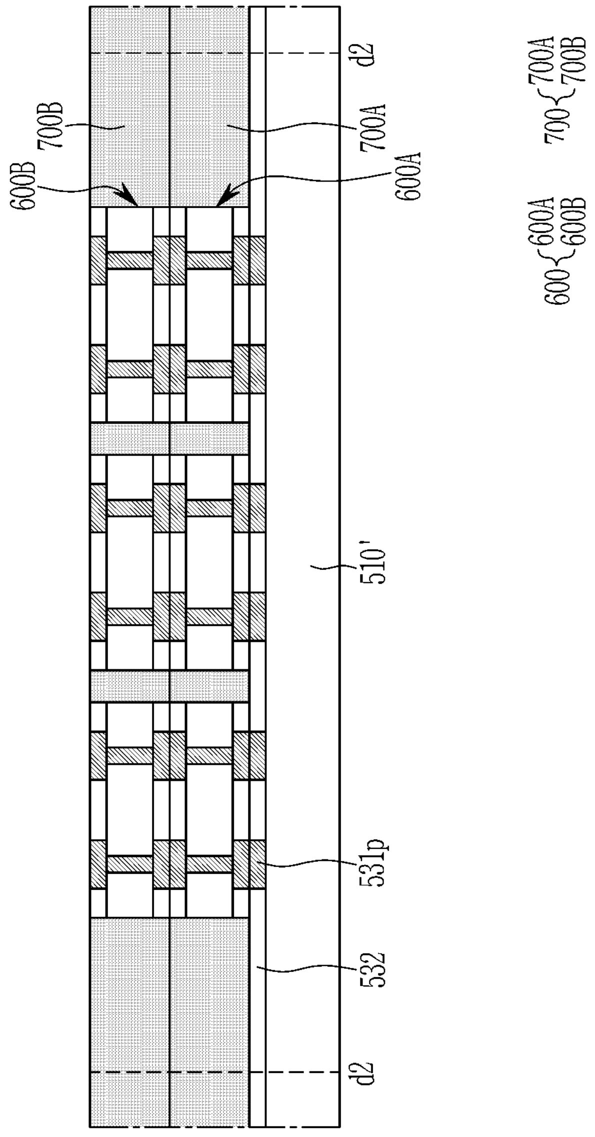
Figure 12:
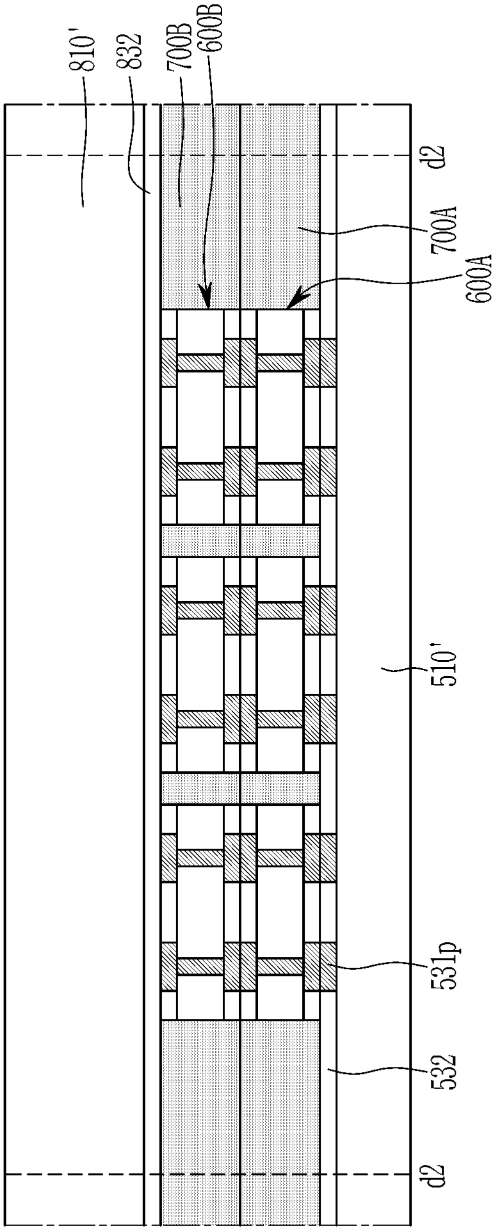

Referring to FIG. 8 to FIG. 9, the forming of the reconstituted wafer RW may include preparing the first semiconductor chip 200 including the first chip through the via 220, encapsulating the first semiconductor chip 200 with the second encapsulant 310, and forming the dielectric through via 400 penetrating through the second encapsulant 310.

In the preparing of the first semiconductor chip 200, the first semiconductor chip 200 may be prepared on a carrier structure 10, and in the encapsulating of the first semiconductor chip 200 with the second encapsulant 310, the encapsulating may be performed on the carrier structure 10. In addition, the manufacturing method of the semiconductor package may further include removing the carrier structure 10.

As the carrier structure 10, a rigid material such as a silicon wafer or glass substrate may be used, and the first semiconductor chip 200 may be positioned on the carrier structure 10 such that a front surface of the first chip pad 231*p* faces the carrier structure 10.

The second encapsulant 310 may be positioned on the carrier structure 10 to encapsulate the first semiconductor chip 200. The second encapsulant 310 may cover a side surface of the first semiconductor chip 200. The chip pads 231*p* and 241*p* of the first semiconductor chip 200 may be exposed at a first surface (i.e., a lower surface) and a second surface (i.e., an upper surface) of the second encapsulant 310 for connection to other components, respectively.

The dielectric through via 400 may be formed by forming a via hole in the second encapsulant 310 and filling an inside of the via hole with a conductive material through a plating process or the like. In an embodiment, the conductive material may be disposed on the upper surface of the second encapsulant 310, and then may be patterned to form the pad region 400*p*. The via region 400*v* and the pad region 400*p* of the dielectric through via 400 may be formed integrally, and there may be no boundary therebetween.

Next, referring to FIG. 10 to FIG. 14, the forming of the sub-package P2 may include preparing a first wafer structure 510' on which the front wiring structure 530 is formed, bonding the second semiconductor chip 600 on the front wiring structure 530 of the first wafer structure 510', encapsulating the second semiconductor chip 600 with the third encapsulant 700, bonding a second wafer structure 810' on the second semiconductor chip 600, forming the second chip through via 520 to be connected to the front wiring structure 530 in the first wafer structure 510', forming the rear wiring structure 540 to be connected to the second chip through via 520 in the first wafer structure 510', and dicing the first wafer structure 510' and the second wafer structure 810'.

In addition, the forming of the sub-package P2 may further include reducing a thickness of the first wafer structure 510' by grinding a surface opposite to a surface of the first wafer structure 510' on which the front wiring structure 530 is formed before forming the second chip through via 520.

Additionally, the forming of the sub-package P2 may further include forming the conductive bump B1 on the second semiconductor chip 500. The conductive bump B1 may be formed on the chip pad 541*p* of the rear wiring structure 540 of the second semiconductor chip 500.

The second semiconductor chip 600 includes the second semiconductor chips 600A and 600B stacked on each other. A second semiconductor chip bonded on the front wiring structure 530 of the first wafer structure 510' may be the second semiconductor chip 600A. A second semiconductor chip to which the second wafer structure 810' is bonded may be the second semiconductor chip 600B. The second semiconductor chip 600B is positioned above the second semiconductor chip 600A. In this case, the forming of the sub-package P2 may further include bonding the second semiconductor chips 600A and 600B with each other. In an embodiment, the second semiconductor chip 600A is bonded to the front wiring structure 530 and encapsulated by the third encapsulant 700A. The second semiconductor chip 600B is bonded to the second semiconductor chip 600A and encapsulated by the third encapsulant 700B.

For convenience of description, all of the first wafer structure 510' on which the front wiring structure 530 is formed, the first wafer structure 510' in which the second chip through via 520 is additionally formed, and the first wafer structure 510' in which the rear wiring structure 540 is additionally formed will be referred to as the first wafer structure 510'.

The bonding of the second semiconductor chip 600 on the front wiring structure 530 of the first wafer structure 510' may be performed by positioning surfaces of the front wiring structure 530 of the first wafer structure 510' and the first chip pad 631*p* of the second semiconductor chip 600 to face each other and performing wafer-to-chip hybrid bonding.

The bonding of the second semiconductor chips 600A and 600B with each other may be performed by positioning the second semiconductor chip 600B on the second semiconductor chip 600A such that a surface on which the first chip pad 631*p* of the second semiconductor chip 600B is disposed faces the second semiconductor chip 600A and performing chip-to-chip hybrid bonding.

In the encapsulating of the second semiconductor chip 600 with the third encapsulant 700, the third encapsulant 700 may cover a side surface of the second semiconductor chip 600, but for connection between the second semiconductor chip 600 and the wafer structures 510' and 810', the chip pads 631*p* and 641*p* of the second semiconductor chip 600 may not be covered.

The second semiconductor chip 600 includes the second semiconductor chips 600A and 600B, and the encapsulating of the second semiconductor chip 600 with the third encapsulant 700 may include encapsulating each of the second semiconductor chips 600A and 600B with a plurality of third encapsulants 700A and 700B.

The bonding of the second wafer structure 810' on the second semiconductor chip 600 may be performed by positioning the second wafer structure 810' on the second semiconductor chip 600 and performing fusion bonding, polymer bonding, or hybrid bonding.

A surface opposite to a surface of the first wafer structure 510' on which the front wiring structure 530 is formed may be processed by grinding, chemical mechanical polishing (CMP), dry etching, wet etching, etc. to reduce the thickness of the first wafer structure 510'. Accordingly, the second semiconductor chip 500 of the semiconductor package 1000A may have a thin thickness, and may reduce a signal transfer path and resistance.

The forming of the second chip through via 520 to be connected to the front wiring structure 530 in the first wafer structure 510' may be performed using a via-last method while the first wafer structure 500' is bonded to the second semiconductor chip 600. However, in an embodiment, the second chip through via 520 may be formed using a via-first or via-middle method before the second semiconductor chip 600 is bonded on the first wafer structure 500'.

The forming of the rear wiring structure 540 may be performed by sequentially forming the wiring layer 541 and the insulating layer 542 by required numbers of layers. The numbers of wiring layers 541 and insulating layers 542 may be changed according to designs thereof. The wiring layer 541 may include a protruding pattern positioned on the insulating layer 542 and/or a buried pattern buried in the insulating layer 542.

The second wafer structure 810' may serve as a support member while performing the reducing of the thickness of the first wafer structure 510', the forming of the second chip through via 520, and the forming of the rear wiring structure 540.

The dicing of the first wafer structure 510' and the second wafer structure 810' may be performed by dicing the first wafer structure 500' and the second wafer structure 800' along a second dicing line d2 using a blade or the like. After dicing, the first wafer structure 510' and the second wafer structure 810' may each have a shape of a semiconductor chip. In this case, the third encapsulant 700 may also be diced together, and each of the second semiconductor chip 500, the third encapsulant 700, and the fourth semiconductor chip 800 may be exposed at the side of the sub-package P2 through the dicing process to be covered with the first encapsulant 900.

The sub-package P2 may be positioned on the reconstituted wafer RW via the conductive bump B1 in the positioning of the sub-package P2 on the reconstituted wafer RW. In an embodiment, the sub-package P2 may be bonded with the reconstituted wafer RW using hybrid bonding.

In the encapsulating of the sub-package P2 with the first encapsulant 900, the first encapsulant 900 may cover a side surface of the second sub-package P2, and may further cover a lower surface thereof. The first encapsulant 900 may not cover upper surface of the second sub-package P2, and thus the fourth semiconductor chip 800 may be exposed at one surface (i.e., an upper surface) of the first encapsulant 900. Through this structure, the semiconductor package 1000A may have a better heat dissipation characteristic.

The redistribution layer structure 100 may be formed after removing the carrier structure 10, and may be positioned on the first semiconductor chip 200 and a surface of the second encapsulant 310 from which the carrier structure 10 has been removed.

The redistribution layer structure 100 may be manufactured by sequentially forming an insulating layer 110 and the wiring layer 120 and forming the passivation layer 130 having an opening exposing the connection pad 120*p*. The conductive bump B2 may be additionally positioned on the redistribution layer structure 100 to fill an opening of the passivation layer 130 and to be connected to the connection pad 120*p*.

As illustrated in the drawing, the redistribution layer structure 100 may be manufactured after positioning the sub-package P2 on the reconstituted wafer RW. In an embodiment, the redistribution layer structure 100 may be formed before positioning sub-package P2.

While this disclosure has been described in connection with what is presently considered to be practical embodiments, it is to be understood that the disclosure is not limited to the disclosed embodiments, but, on the contrary, is intended to cover various modifications and equivalent dispositions included within the spirit and scope of the appended claims.

What is claimed is:

1. A semiconductor package comprising:
a redistribution layer structure;
a first sub-package positioned on the redistribution layer structure;
a second sub-package positioned on the first sub-package; and
a first encapsulant positioned on the first sub-package and encapsulating the second sub-package,
wherein the first sub-package includes:
a first semiconductor chip including a first chip through via electrically connected to the redistribution layer structure;
a second encapsulant encapsulating the first semiconductor chip; and
a dielectric through via penetrating through the second encapsulant and electrically connected to the redistribution layer structure, and
wherein the second sub-package includes:
a second semiconductor chip including a plurality of second chip through vias, each second chip through via electrically connected to one of the first chip through via and the dielectric through via;
a third semiconductor chip positioned on the second semiconductor chip and electrically connected to the plurality of second chip through vias;
a third encapsulant encapsulating the third semiconductor chip; and
a fourth semiconductor chip positioned on the third semiconductor chip, wherein each of the second semiconductor chip, the third encapsulant, and the fourth semiconductor chip is exposed at a side surface of the second sub-package and covered with the first encapsulant.

2. The semiconductor package of claim 1, wherein:
the second semiconductor chip includes a first chip pad,
the third semiconductor chip includes a second chip pad,
the first chip pad and the second chip pad contact each other, and
the first chip pad is bonded to the second chip pad.

3. The semiconductor package of claim 1, wherein:
the third semiconductor chip is provided in a plurality of third semiconductor chips that are stacked on each other in a vertical direction, and
at least one of the plurality of third semiconductor chips includes a third chip through via electrically connecting the plurality of third semiconductor chips with each other.

4. The semiconductor package of claim 1, further comprising:
a conductive bump positioned between the first sub-package and the second sub-package and connecting the first sub-package to the second sub-package.

5. The semiconductor package of claim 1, wherein:
the first semiconductor chip includes a first chip pad,
the dielectric through via includes a pad region positioned on an upper surface of the second encapsulant,
the second semiconductor chip includes a plurality of second chip pads, and
each of the plurality of second chip pads is contacted and bonded to one of the first chip pad and the pad region of the dielectric through via.

6. A semiconductor package comprising:
a redistribution layer structure;
a first sub-package positioned on the redistribution layer structure;
a second sub-package positioned on the first sub-package; and
a first encapsulant positioned on the first sub-package and encapsulating the second sub-package,
wherein the first sub-package includes:
a first semiconductor chip including a first chip through via electrically connected to the redistribution layer structure;
a second encapsulant encapsulating the first semiconductor chip; and
a dielectric through via penetrating through the second encapsulant and electrically connected to the redistribution layer structure, and
wherein the second sub-package includes:
a second semiconductor chip electrically connected to each of the first chip through via and the dielectric through via, and including a front surface and a rear surface, wherein the second semiconductor chip further includes:
a front wiring structure positioned on the front surface,
a rear wiring structure positioned on the rear surface thereof, and
a second chip through via connecting the front wiring structure to the rear wiring structure;
a third semiconductor chip positioned on the front surface of the second semiconductor chip and electrically connected to the second chip through via;
a third encapsulant encapsulating the third semiconductor chip; and
a fourth semiconductor chip positioned on the third semiconductor chip, wherein the second semiconductor chip receives power through the first chip through via.

7. The semiconductor package of claim 6,
wherein the second semiconductor chip receives additional power through the dielectric through via.

8. The semiconductor package of claim 6,
wherein the third encapsulant includes an inorganic material.

9. The semiconductor package of claim 6,
wherein the second encapsulant includes an inorganic material.

10. The semiconductor package of claim 6,
wherein the first encapsulant includes an organic material.

11. The semiconductor package of claim 6,
wherein a thickness of the second semiconductor chip is smaller than that of each of the first semiconductor chip and the third semiconductor chip.

12. The semiconductor package of claim 6,
wherein a width of the second semiconductor chip is greater than that of each of the first semiconductor chip and the third semiconductor chip.

13. The semiconductor package of claim 6, wherein:
the first semiconductor chip includes at least one of an input/output circuit and an analog circuit, and
the second semiconductor chip includes a logic circuit.

14. The semiconductor package of claim 13,
wherein the third semiconductor chip includes a memory circuit.

15. The semiconductor package of claim 13,
wherein the third semiconductor chip is a dummy chip.

16. The semiconductor package of claim 6,
wherein the fourth semiconductor chip is a dummy chip.

* * * * *